US011075137B2

(12) United States Patent
Lin et al.

(10) Patent No.: US 11,075,137 B2
(45) Date of Patent: Jul. 27, 2021

(54) HIGH POWER MODULE PACKAGE STRUCTURES

(71) Applicant: SEMICONDUCTOR COMPONENTS INDUSTRIES, LLC, Phoenix, AZ (US)

(72) Inventors: Yusheng Lin, Phoenix, AZ (US); Jerome Teysseyre, Scottsdale, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/243,505

(22) Filed: Jan. 9, 2019

(65) Prior Publication Data

US 2019/0341332 A1 Nov. 7, 2019

Related U.S. Application Data

(63) Continuation-in-part of application No. 16/145,918, filed on Sep. 28, 2018.
(Continued)

(51) Int. Cl.
*H01L 23/373* (2006.01)
*H01L 23/31* (2006.01)
(Continued)

(52) U.S. Cl.
CPC .......... *H01L 23/3735* (2013.01); *H01L 21/52* (2013.01); *H01L 23/3107* (2013.01);
(Continued)

(58) Field of Classification Search
CPC ... H01L 23/373; H01L 23/3735; H01L 23/34; H01L 23/42; H01L 21/563; H01L 29/7393; H01L 29/7395; H01L 2021/60022; H01L 2224/02–0213; H01L 2224/0214–0217; H01L 2224/0218–0219; H01L 2224/03015; H01L 2224/07–0805; H01L 2224/08057–081; H01L 2224/08123; H01L 2224/08151;
(Continued)

(56) References Cited

U.S. PATENT DOCUMENTS 5,543,740 A 8/1996 Wong
6,323,549 B1 11/2001 deRochemont et al.
(Continued)

*Primary Examiner* — Sonya McCall-Shepard
(74) *Attorney, Agent, or Firm* — Brake Hughes Bellermann LLP

(57) ABSTRACT

A dual-side cooling package includes a first semiconductor die and a second semiconductor die disposed between a first direct bonded metal (DBM) substrate and a second DBM substrate. A metal surface of the first DBM substrate defines a first outer surface of a package and a metal surface of the second DBM substrate defines a second outer surface of the package. The first semiconductor die is thermally coupled to the first DBM substrate. A first conductive spacer thermally couples the first semiconductor die to the second DBM substrate. The second semiconductor die is thermally coupled to a second conductive spacer. Further, one of the second semiconductor die and the second conductive spacer is thermally coupled to the first DMB substrate and the other of the second semiconductor die and the second conductive spacer is thermally coupled to the second DBM substrate.

21 Claims, 26 Drawing Sheets

Related U.S. Application Data

(60) Provisional application No. 62/665,598, filed on May 2, 2018.

(51) Int. Cl.

| | | |
|---|---|---|
| *H01L 25/07* | (2006.01) | |
| *H01L 23/433* | (2006.01) | |
| *H01L 21/52* | (2006.01) | |
| *H01L 29/739* | (2006.01) | |
| *H01L 23/498* | (2006.01) | |
| *H01L 23/00* | (2006.01) | |
| *H01L 25/00* | (2006.01) | |
| *H01L 25/065* | (2006.01) | |
| *H01L 29/861* | (2006.01) | |

(52) U.S. Cl.
CPC ...... *H01L 23/3114* (2013.01); *H01L 23/3121* (2013.01); *H01L 23/3135* (2013.01); *H01L 23/4334* (2013.01); *H01L 23/49822* (2013.01); *H01L 24/20* (2013.01); *H01L 25/0657* (2013.01); *H01L 25/072* (2013.01); *H01L 25/50* (2013.01); *H01L 29/7393* (2013.01); *H01L 29/861* (2013.01); *H01L 2225/06589* (2013.01)

(58) Field of Classification Search
CPC ............... H01L 2224/08221–08225; H01L 2224/09–09055; H01L 2224/15–1605; H01L 2224/16057; H01L 2224/161; H01L 2224/16145; H01L 2224/16221; H01L 2224/33181; H01L 23/538; H01L 23/5383; H01L 23/5385; H01L 23/5386; H01L 2924/13055; H01L 29/66325; H01L 23/31–3135; H01L 2924/181; H01L 25/041–043; H01L 25/0657; H01L 2225/06503; H01L 25/0652; H01L 25/071; H01L 25/112; H01L 27/0688; H01L 27/0694; H01L 2027/11883–11888; H01L 2224/80895; H01L 2224/83895; H01L 2224/83896; H01L 23/3107; H01L 23/3114; H01L 23/3121; H01L 23/3142; H01L 23/3157; H01L 23/3192; H01L 21/56; H01L 2224/73204; H01L 23/433; H01L 23/4334; H01L 2023/0418; H01L 2023/4031; H01L 2023/4037; H01L 2023/4068

See application file for complete search history.

(56) References Cited

U.S. PATENT DOCUMENTS

| | | | |
|---|---|---|---|
| 7,047,637 B2 | 5/2006 | deRochemont et al. | |
| 7,068,097 B2 | 6/2006 | Atmur | |
| 7,227,198 B2 | 6/2007 | Pavier et al. | |
| 7,301,235 B2 | 11/2007 | Schaffer et al. | |
| 7,425,757 B2 | 9/2008 | Takubo | |
| 7,675,148 B2 | 3/2010 | Lim et al. | |
| 7,736,397 B2 | 6/2010 | Lee et al. | |
| 7,777,315 B2 | 8/2010 | Noquil | |
| 8,198,139 B2 | 6/2012 | Yang | |
| 8,537,550 B2 | 9/2013 | Higuchi et al. | |
| 8,640,611 B2 | 2/2014 | Sasine et al. | |
| 8,723,300 B2 | 5/2014 | Wu et al. | |
| 9,390,996 B2 * | 7/2016 | Jeon | H01L 23/4334 |
| 2002/0079590 A1 * | 6/2002 | Nakaoka | H01L 23/3114 |
| | | | 257/777 |
| 2005/0280163 A1 | 12/2005 | Schaffer et al. | |
| 2008/0023807 A1 | 1/2008 | Noquil et al. | |
| 2010/0065954 A1 | 3/2010 | Tu et al. | |
| 2010/0155914 A1 | 6/2010 | Lin et al. | |
| 2011/0260314 A1 | 10/2011 | Minotti | |
| 2013/0099364 A1 | 4/2013 | Liu et al. | |
| 2014/0063768 A1 * | 3/2014 | Tanaka | H05K 3/36 |
| | | | 361/784 |
| 2014/0252579 A1 | 9/2014 | Chang et al. | |
| 2016/0113107 A1 * | 4/2016 | Wang | H05K 3/3431 |
| | | | 361/783 |
| 2016/0247751 A1 | 8/2016 | Kinzer | |
| 2017/0287875 A1 * | 10/2017 | Gao | H01L 25/50 |
| 2018/0049311 A1 | 2/2018 | Hoang et al. | |
| 2018/0061807 A1 | 3/2018 | Lee | |

* cited by examiner

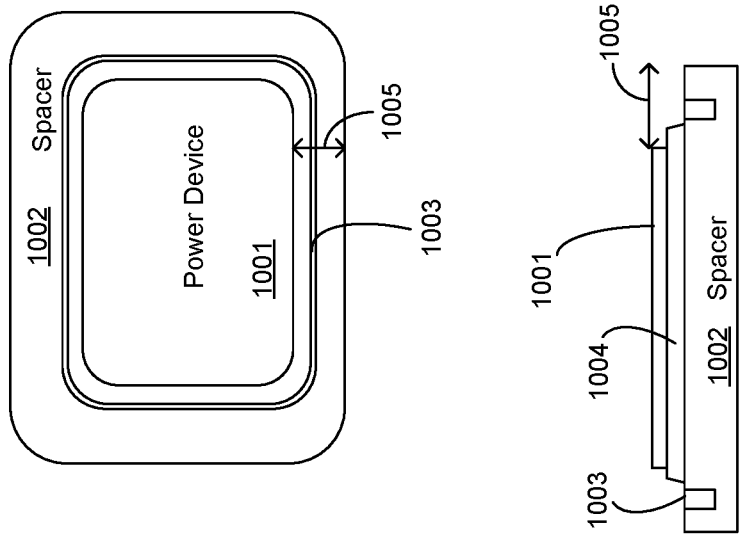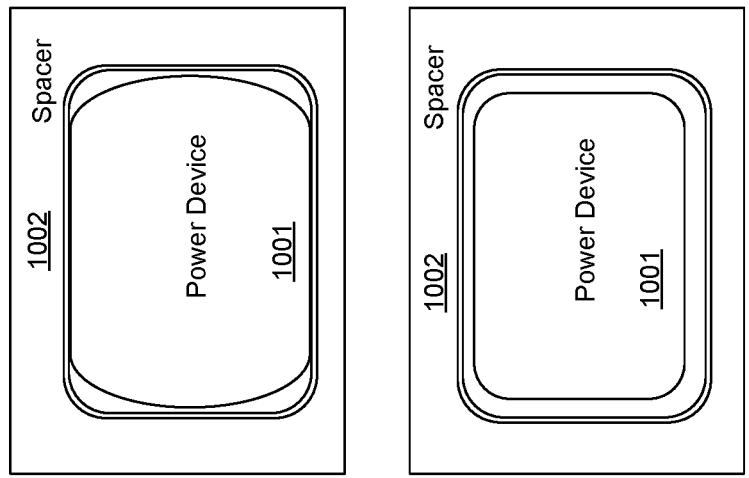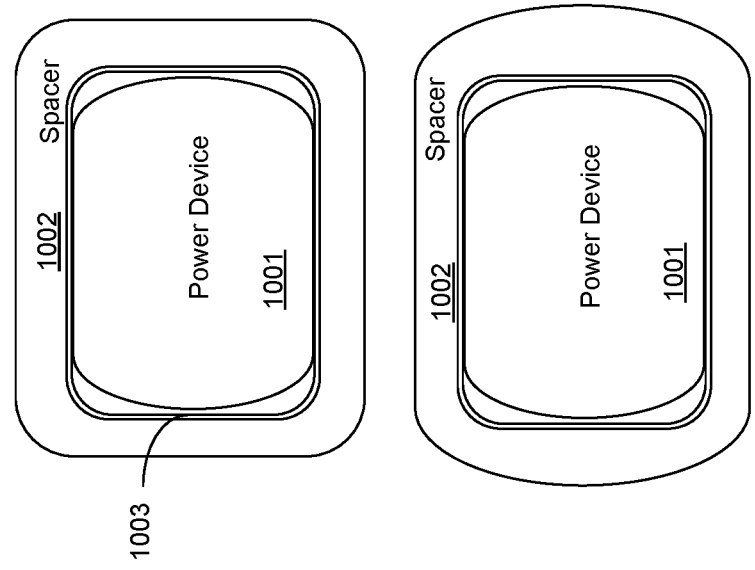

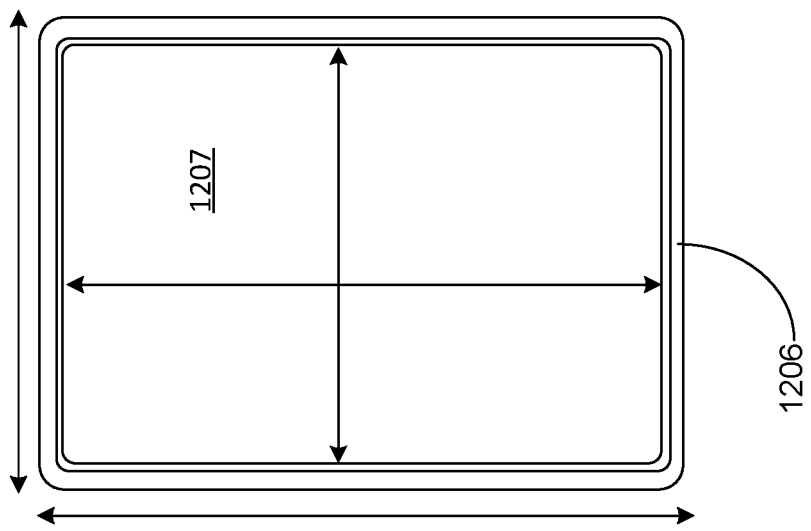
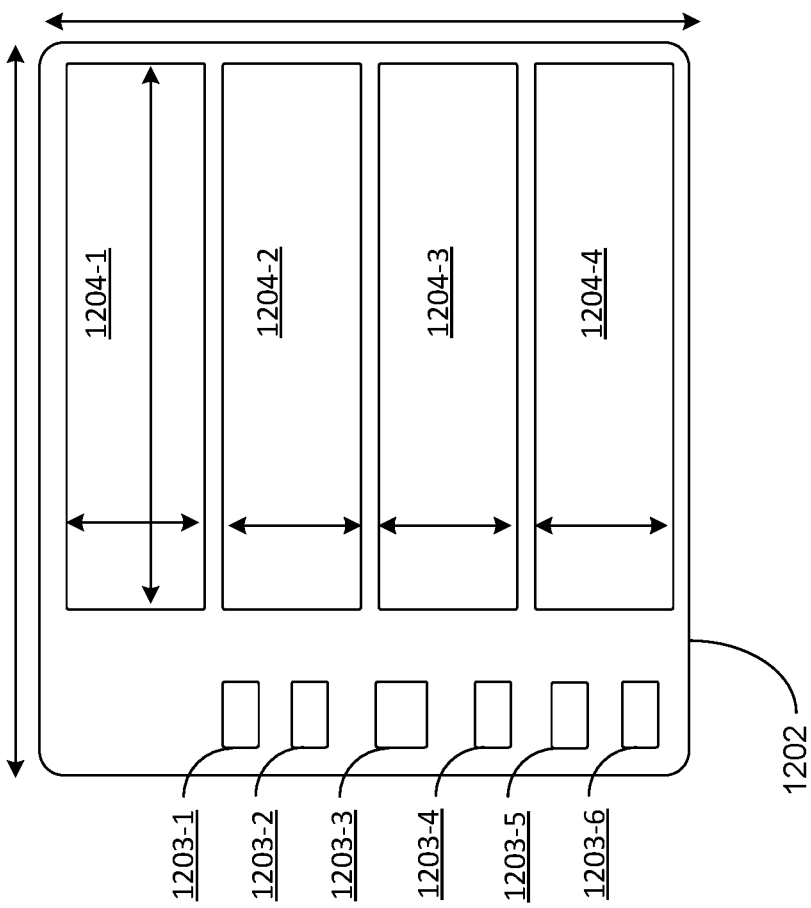

```
┌─────────────────────────────────────────────────────────────────────────┐
│ Disposing a first semiconductor die and a second semiconductor die between a first direct │
│ bonded metal (DBM) substrate and a second DBM substrate, a metal surface of the first │
│ DBM substrate defining a first outer surface of a dual-sided cooling package and a metal │
│ surface of the second DBM substrate defining a second outer surface of the dual-sided │
│ cooling package                                                          │
│                                  2510                                    │
└─────────────────────────────────────┬───────────────────────────────────┘
                                      │
┌─────────────────────────────────────┴───────────────────────────────────┐
│     Thermally coupling the first semiconductor die to the first DBM substrate │
│                                  2520                                    │
└─────────────────────────────────────┬───────────────────────────────────┘
                                      │
┌─────────────────────────────────────┴───────────────────────────────────┐
│  Disposing the first conductive spacer between first semiconductor die and the second │
│                              DBM substrate                               │
│                                  2530                                    │
└─────────────────────────────────────┬───────────────────────────────────┘
                                      │
┌─────────────────────────────────────┴───────────────────────────────────┐
│   Thermally coupling the first conductive spacer to first semiconductor die and to the │
│                          second DBM substrate                            │
│                                  2540                                    │
└─────────────────────────────────────┬───────────────────────────────────┘
                                      │
┌─────────────────────────────────────┴───────────────────────────────────┐
│  Disposing a second conductive spacer between the first DBM substrate and the second │
│                              DBM substrate                               │
│                                  2550                                    │
└─────────────────────────────────────┬───────────────────────────────────┘
                                      │
┌─────────────────────────────────────┴───────────────────────────────────┐
│   Thermally coupling the second conductive spacer to the second semiconductor die │
│                                  2560                                    │
└─────────────────────────────────────┬───────────────────────────────────┘
                                      │
┌─────────────────────────────────────┴───────────────────────────────────┐
│ Thermally coupling one of the second semiconductor die and the second conductive │
│   spacer to the first DBM substrate and thermally coupling the other of the second │
│  semiconductor die and the second conductive spacer to the second DBM substrate │
│                                  2570                                    │
└─────────────────────────────────────────────────────────────────────────┘
```

2500

FIG. 25

HIGH POWER MODULE PACKAGE STRUCTURES

RELATED APPLICATION

This application claims priority to, and the benefit of, U.S. Provisional Application No. 62/665,598, filed May 2, 2018, and is a continuation-in-part of U.S. patent application Ser. No. 16/145,918, filed Sep. 28, 2018, both of which applications are hereby incorporated by reference in their entireties herein.

TECHNICAL FIELD

This description relates to high power device module package structures

BACKGROUND

Semiconductor power devices can be manufactured as discrete devices as opposed to being integrated in an integrated circuit (IC). As is typical with power devices, thermal performance may dictate failure rates when components are heated above certain temperatures. It may be desirable for some applications to engineer and manufacture power devices with sufficient performance, low cost, and high reliability. Thus, a need exists for systems, methods, and apparatus to address the shortfalls of present technology and to provide other new and innovative features.

SUMMARY

In a general aspect, a circuit package includes a semiconductor die disposed between a first high voltage isolation carrier and a second high voltage isolation carrier. In the circuit package, the semiconductor die is positioned to conduct heat to (i.e., is thermally coupled to) the first high voltage isolation carrier. A first molding material is disposed between the semiconductor die and the first high voltage isolation carrier, and a conductive spacer is disposed between the semiconductor die and the second high voltage isolation carrier. The conductive spacer is thermally coupled to both the semiconductor die and to the second high voltage isolation carrier. Further, a second molding material encapsulates the first molding material and the conductive spacer.

In a general aspect, a device package includes a first direct bonded metal (DBM) substrate, a second DBM substrate, a first vertical stack, and a second vertical stack. A metal surface of the first DBM substrate defines a first outer surface of the package and a metal surface of the second DBM substrate defines a second outer surface of the package. The first vertical stack within the package includes a first semiconductor die disposed between the first DBM substrate and the second DBM substrate. The first semiconductor die is thermally coupled to the first DBM substrate. Further, a conductive spacer is disposed between semiconductor die and the second DBM substrate. The conductive spacer is thermally coupled to first semiconductor die and to the second DBM substrate. The second vertical stack within the package includes a second semiconductor die and a second conductive spacer disposed between the second semiconductor die and the second DBM substrate. The second semiconductor die is thermally coupled to the second conductive spacer. In the package, one of the second semiconductor die and the second conductive spacer is thermally coupled to the first substrate, and the other of the second semiconductor die and the second conductive spacer is thermally coupled to the second DBM substrate.

BRIEF DESCRIPTION OF THE DRAWINGS

FIGS. 10A through 10F are illustrations of examples of different rectangular shapes with rounded corners of an example device die, and different rectangular shapes (with and without rounded corners) of an example conductive spacer.

FIGS. 12A and 12B are schematic plan view illustrations of example die.

FIG. 25 illustrates an example method for packaging power devices in a dual-side cooling package.

DESCRIPTION

In some implementations, the submodules and packages described herein include high power devices that are assembled together into a single package. For example, the packages can include multiple semiconductor die (e.g., silicon semiconductor die, silicon carbide (SiC) semiconductor die, insulated-gate bipolar transistor (IGBT) die, metal-oxide-semiconductor field effect transistor (MOSFET) die, etc.). Assembling multiple semiconductor die together in a single package can provide high performance and high reliability configurations for electrical performance of the submodules. Alternatively or additionally, assembling multiple semiconductor die together in a single package can lead to improvement in thermal management while maintaining proper electrical performance of the submodules. The multiple semiconductor die may be assembled together in the single package so that two package components (including packaging materials or substrates) can conduct heat to and from each other (in other words, the two package components can be thermally coupled).

In some implementations, packages described herein can be used in applications with high voltages (e.g., higher than 600 V), high current densities (e.g., between 100 A to 800 A (e.g., 400 A)), and/or high switching frequencies (e.g., greater than 1 kHz). In some implementations, the packages can be used in a variety of industrial applications including, for example, automotive applications (e.g., automotive high power module (AHPM), electrical vehicles, and hybrid electrical vehicles), computer applications, industrial equipment, traction invertors, on-board charging applications, inverter applications, and/or so forth. In some implementations, one or more of the semiconductor die described herein can include, or can be, at least a portion of an automotive high power module (AHPM) power device.

Example packages (such as inverters for industrial applications) can incorporate a wide variety of components, including insulated-gate bipolar transistor (IGBT) power devices, power modules, high-voltage DC line capacitors, main circuit bus bars, a power module drive circuit board, a motor control circuit board, three-phase current sensors, and DC and heavy-current AC connectors, etc.

Figure 1A:
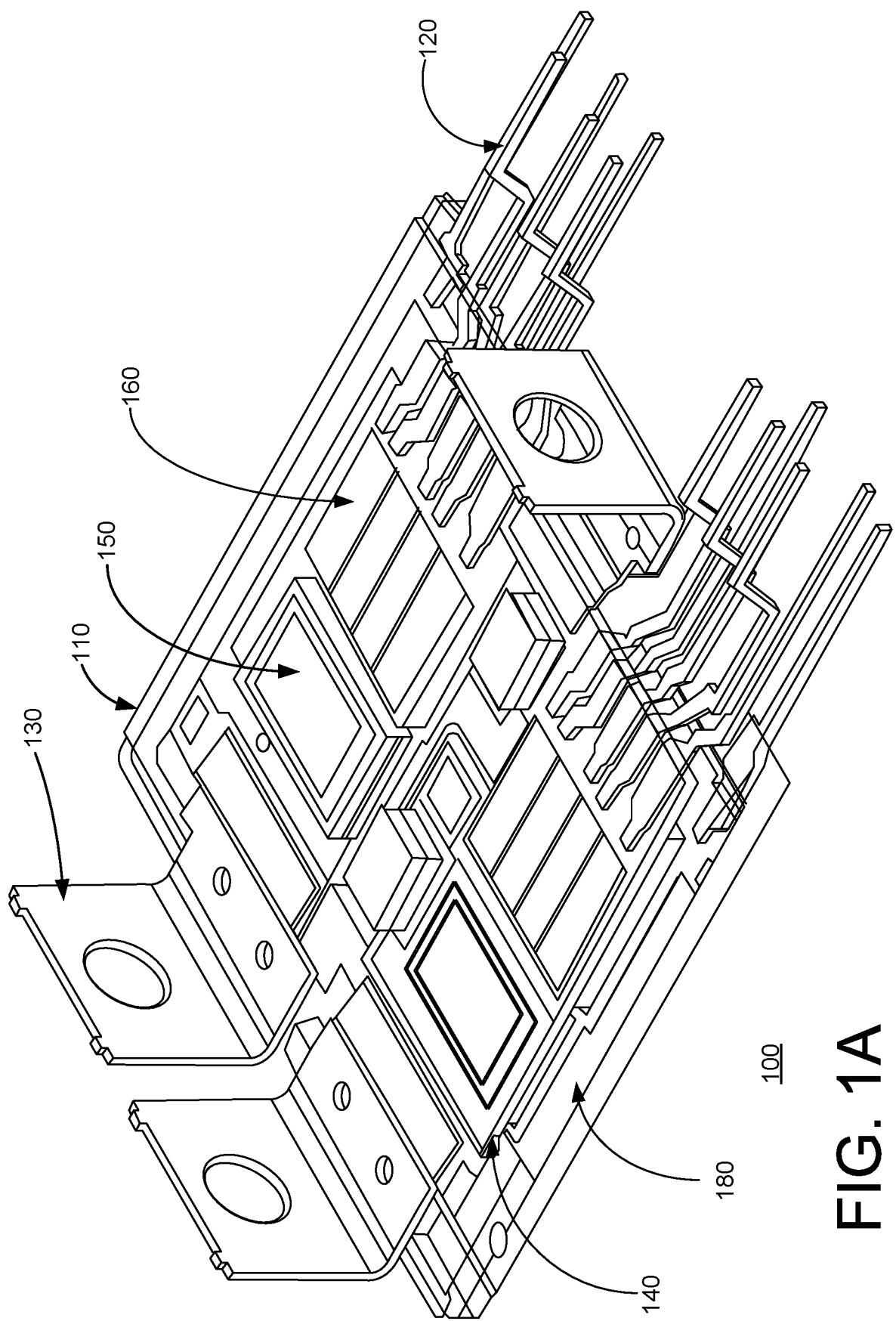
FIGS. 1A and 1B are diagrams that illustrate perspective views of an example industrial package including power device modules with dual-sided cooling.
Figure 1B:
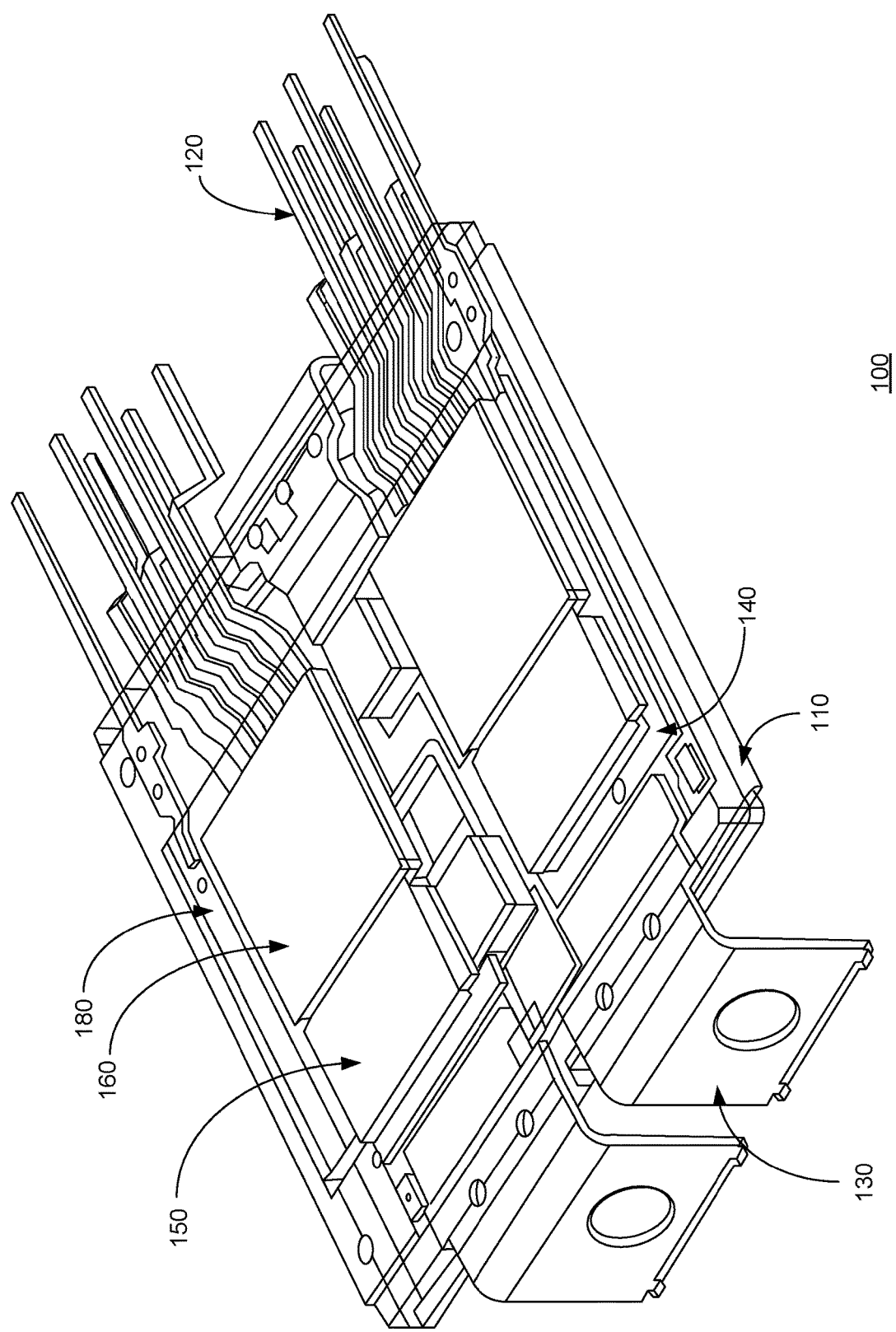

FIGS. 1A and 1B are diagrams that illustrate perspective views of an example package 100 that includes power device modules with dual-sided cooling, according to an example embodiment. Package 100 is illustrated with some components being partially transparent so that the component disposed therein may be visible. FIG. 1A shows a perspective view of a top side of package 100, while FIG. 1B shows a perspective view of a bottom side of package 100.

Package 100 may include a leadframe 110 (e.g., a mounting frame), which includes bolt connectors 130 and external electrical connection leads 120. In example implementations, leadframe 110 may be coupled to a pair of opposing substrates 140, 180. One or more of substrates 140, 180 can be, for example, a carrier (high voltage isolation carrier) with insulating properties that provide high voltage isolation of package components. An example high voltage isolation carrier can be a direct bonded metal (DBM) substrate (e.g., direct bonded copper (DBC) substrate, DBM circuit boards). In some implementations, one or more of the DBM substrates 140, 180 can include a dielectric layer disposed between two metal layers.

Package 100 may further include power device components such as power device module 150 and power device module 160. Power device module 150 and power device module 160 may be enclosed between (e.g., in a gap between) the pair of opposing substrates 140, 180. The enclosed components (e.g., power device module 150, power device module 160, etc.) may be positioned to conduct heat to (in other words, be thermally coupled (e.g., bonded) to) one or both of substrate 140 and/or substrate 180.

Power device modules 150, 160 may include power devices (e.g., silicon semiconductor die, silicon carbide (SiC) semiconductor die, insulated-gate bipolar transistors (IGBTs), metal-oxide-semiconductor field effect transistor (MOSFET) die, fast recovery diodes (FRD), etc.) that are assembled in device packages (e.g., a double sided direct cooled power device package) to benefit from dual side cooling, which may be provided using the pair of opposing substrates (e.g., substrate 140 and substrate 180). The device packages may be assembled together to provide high performance, reliability, and/or improvement in thermal management while maintaining proper electrical performance of the power device modules.

In some implementations, a device can be referred to as a device die or as a semiconductor die. Further, the pair of the opposing substrates 140, 180 in a device package may be referred to as the top substrate and the bottom substrate. A direction or axis that is substantially perpendicular to a plane aligned along each of the pair of opposing substrates can be referred to as a vertical direction. A direction or axis that is substantially parallel to the planes of the pair of the opposing substrates can be referred to as a lateral, a horizontal, or a longitudinal direction.

In example implementations, the power devices may be assembled as vertical device stacks in device packages. A vertical device stack may include a vertical arrangement of a power device (e.g., an insulated-gate bipolar transistor (IGBT), a fast recovery diode (FRD), etc.) that is thermally coupled on one side to a first cooling substrate (e.g., substrate 140) and thermally coupled on the other side to a conductive block made of electrically and thermally conductive material (e.g., copper). The conductive block (e.g., a copper spacer) may be thermally coupled to a second cooling substrate (e.g., substrate 180) substrate.

Figure 2:
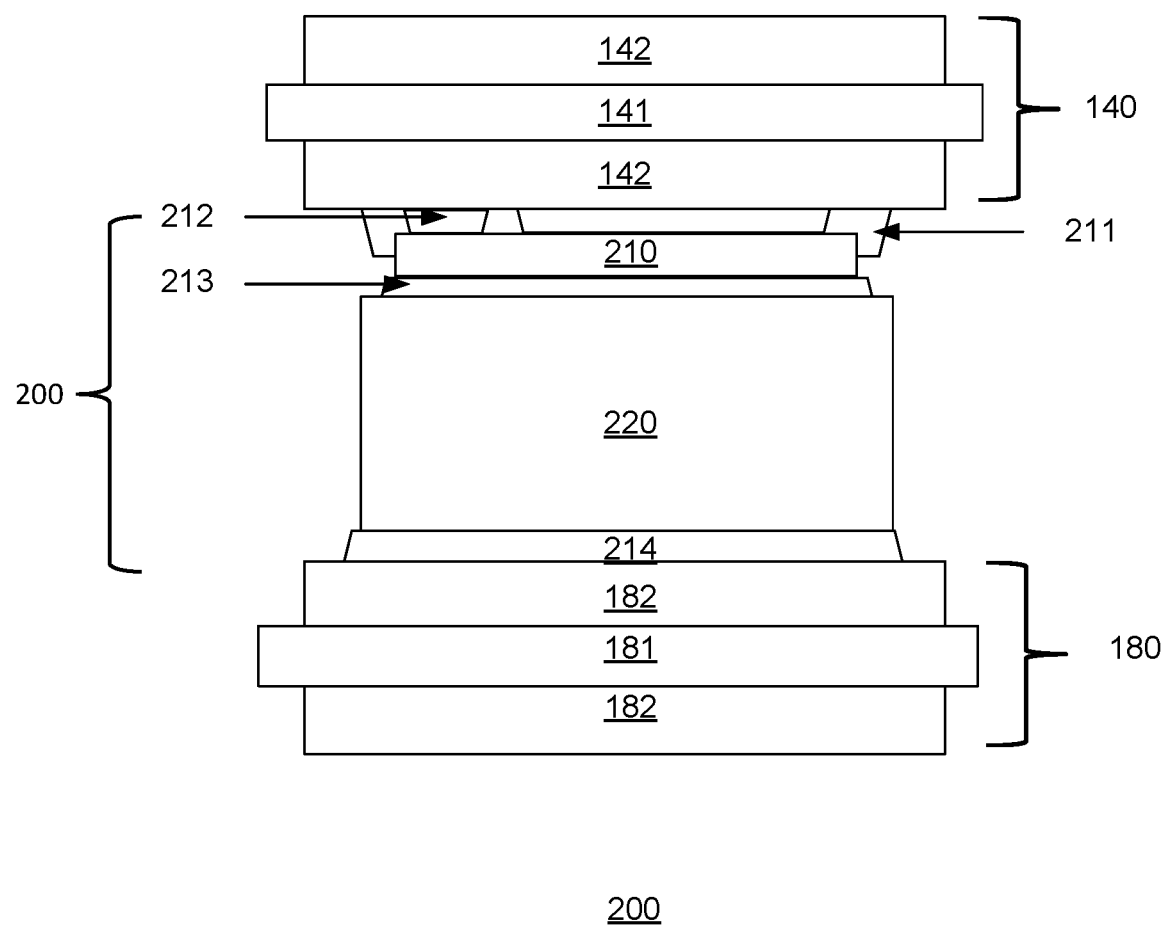
FIG. 2 is a schematic illustration of an example vertical device stack including a power device and a conductive spacer.

FIG. 2 shows an example vertical device stack 200 disposed between substrate 140 and substrate 180. Substrate 140 and substrate 180 may, for example, include dielectric layers (e.g., ceramic layer, polymer layer) 141 and 181 that are plated, coated, or printed, on both sides, with copper or other electrically conductive material layers (e.g., conductive layer 142, conductive layer 182). Dielectric layers 141 and 181 may be made from electrically insulating, but thermally conductive materials (e.g., Zr-doped alumina). In some implementations, conductive layer 142 and conductive layer 182 may be, or can include, a copper layer.

Vertical device stack 200 may, for example, include a device die 210 (e.g., a power IGBT) that is coupled (e.g., bonded) on one side to substrate 140 and on another side to a conductive spacer 220. Conductive spacer 220 is coupled on one side to substrate 180 and on another side to device die 210. The couplings in the vertical device stack structure (i.e., coupling mechanism 212 between substrate 140 and device die 210, coupling mechanism 213 between device die 210 and conductive spacer 220, and coupling mechanism 214 between conductive spacer 220 and substrate 180) can include, or can be, for example, a solder, a sinter, a fusion bond, and/or so forth. In an example implementation, device die may be an IGBT that is coupled to substrate 140 in a flip chip configuration. Device stack 200 may further include a layer of underfill material 211 (also can be referred to as underfill). Underfill material 211 may be used to fill in a gap between a flipped chip and substrate 140 when coupling device die 210 (e.g., an IGBT) in a flip chip configuration (i.e., a source down orientation) to the substrate surface. In some implementations, underfill material 211 may, for example, be an epoxy or a polymer encapsulant material.

In example implementations, a device package (e.g., a double sided direct cooled power module package) may include more than one semiconductor device die enclosed within a pair of opposing substrates. Each semiconductor die may be arranged in a vertical device stack (e.g., device stack 300a, device stack 300b, FIG. 3) that includes a conductive spacer (e.g., a copper block). More than one more than one vertical device stacks may be enclosed within the pair of opposing substrates.

Figure 3:
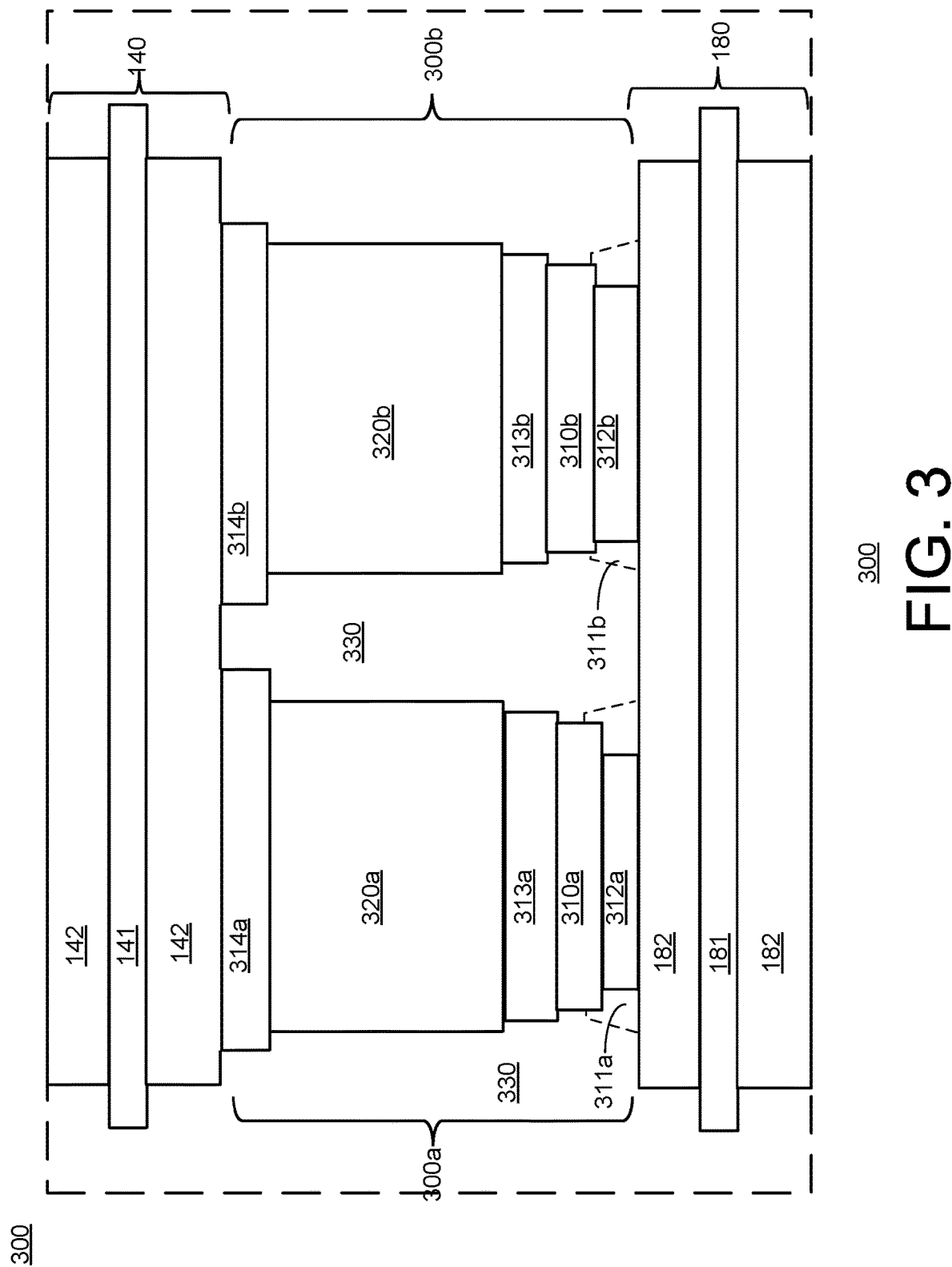
FIG. 3 is a schematic illustration of an example device package that includes two semiconductor die enclosed within a pair of opposing substrates.

FIG. 3 shows an example device package 300 that includes two semiconductor devices (e.g., power device 310a, power device 310b) enclosed within a pair of opposing substrates (e.g., substrate 140 and substrate 180). Power device 310a may, for example, be included in a vertical device stack 300a that includes a conductive spacer 320a, while power device 310b may, for example, be included in a vertical device stack 300b that includes a conductive spacer 320b. In vertical device stack 300a, power device 310a may be coupled on one side to substrate 180 and on another side to conductive spacer 320a. Conductive spacer 320a may be coupled on one side to substrate 140 and on another side to power device 310a. Similarly, in vertical device stack 300b, power device 310b may be coupled on one side to substrate 180 and on another side to conductive spacer 320b. Conductive spacer 320b may be coupled on one side to substrate 140 and on another side to power device 310b. The inter-component coupling mechanisms in vertical device stack 300a (i.e., coupling mechanism 312a between substrate 180 and power device 310a, coupling mechanism 313a between power device 310a and conductive spacer 320a, and coupling mechanism 314a between conductive spacer 320a and substrate 140) and in vertical device stack 300b (i.e., coupling mechanism 312b between substrate 180 and power device 310b, coupling mechanism 313b between power device 310b and conductive spacer 320b, and coupling mechanism 314b between conductive spacer 320b and substrate 140) may be solder, sinter or fusion bonds.

In example implementations, power device 310a and power device 310b may be IGBTs that are coupled to substrate 140 in flip chip configurations (i.e., source down orientations). Vertical device stacks 300a, 300b may further include layers of underfill material 311a, 311b that are used in packaging processes for coupling a semiconductor die to a surface in a flip chip configuration and for protecting the coupling mechanisms (e.g., coupling mechanism 312a, 312b).

In example implementations, voids or open spaces in device package 300 between substrate 140, substrate 180, vertical device stack 300a, and vertical device stack 300b may be filled with a molding material 330 (e.g., a polymer or epoxy) to encapsulate vertical device stack 300a and vertical device stack 300b in device package 300. Accordingly, underfill material 311a, 311b can be encapsulated within the molding material 330. In package 300, underfill material 311a, 311b can be a first isolation material and molding material 330 can function as a second isolation material.

FIG. 3 shows an example implementation of device package 300 in which vertical device stacks 300a and 300b are arranged so that both of the enclosed power devices 310a and 310b are coupled to the same substrate 180 and both conductive spacer 320a and conductive spacer 320b are coupled to the same opposing substrate (i.e., substrate 140).

In some example implementations, one of the two vertical device stacks (e.g., vertical device stack 300b) may be inverted. In other words, vertical device stacks 300a and 300b with two enclosed power devices and two enclosed conductive spacers may be arranged so that power device 310a of vertical device stack 300a is coupled to substrate 180 while power device 310b of vertical device stack 300b is coupled to the opposing substrate 140, and conductive spacer 320a of vertical device stack 300a is coupled to substrate 140 while conductive spacer 310b of vertical device stack 300b is coupled to the opposing substrate 180.

Figure 4:
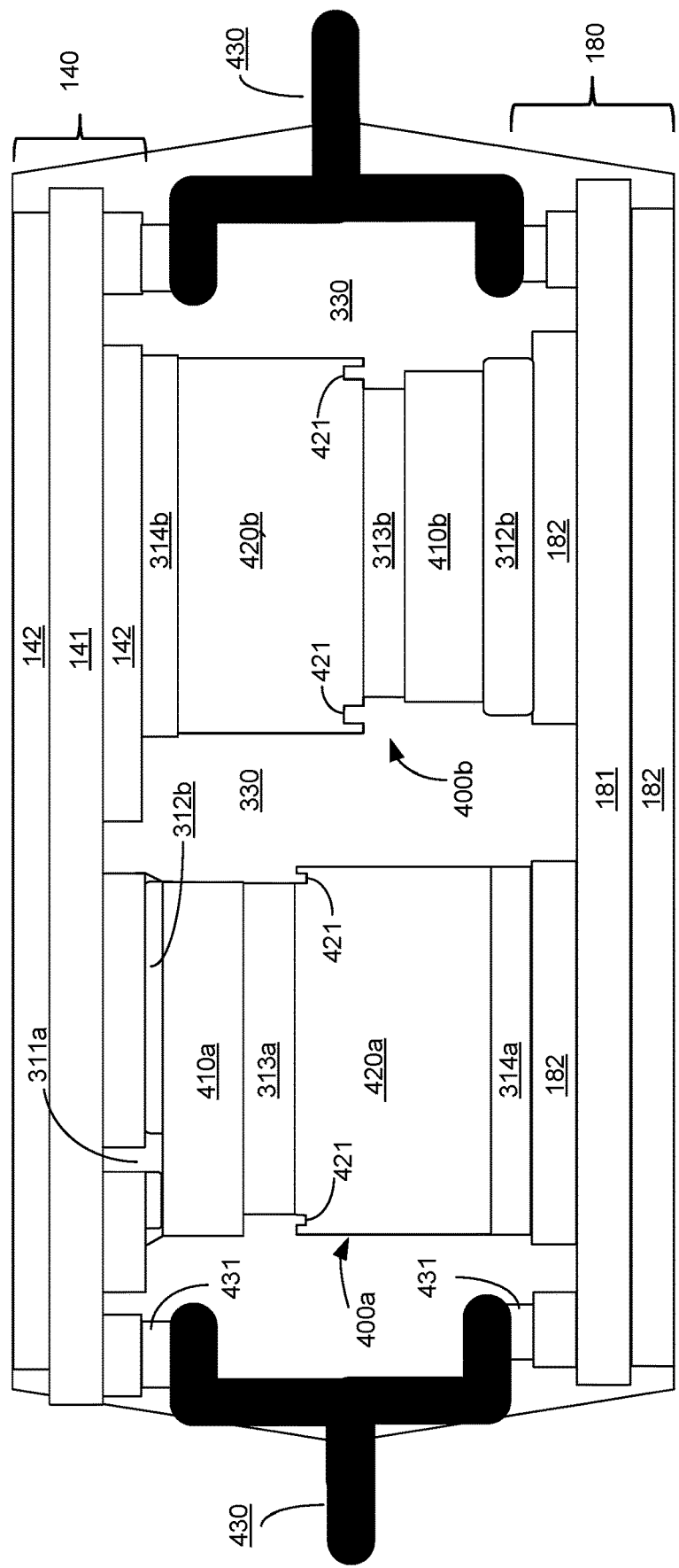
FIGS. 4 and 5 illustrate example device packages.
Figure 5:
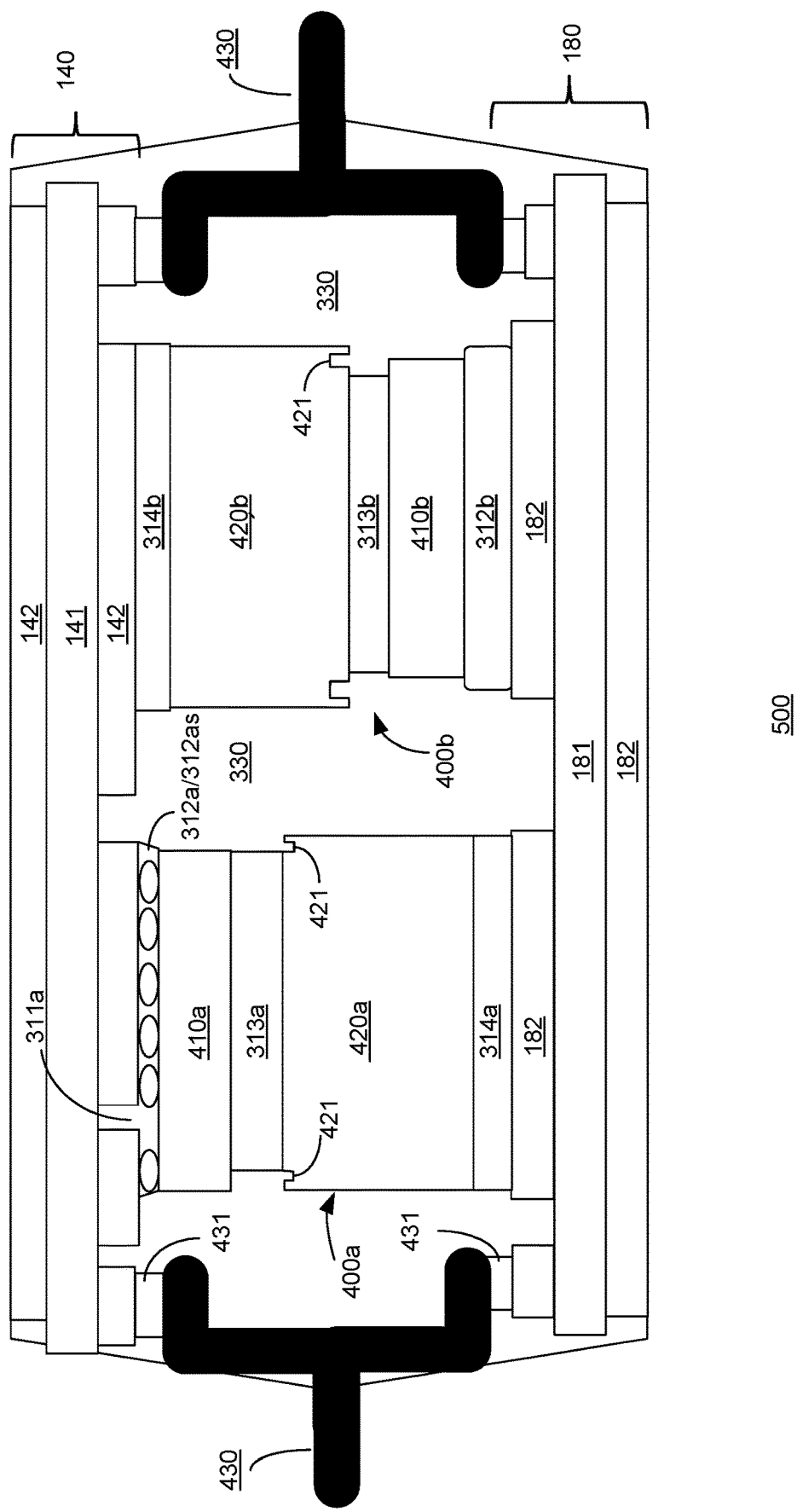

FIGS. 4 and 5 show example device packages 400 and 500 in which a first of the two enclosed power devices is coupled to a first of the pair of enclosing substrates while the second of the power devices is coupled to a second of the pair of enclosed substrates. Outer surfaces of the substrates 140, 180 can define the outer surfaces of the device packages 400, 500.

In device packages 400 and 500, vertical device stack 400a and 400b are arranged so that enclosed power device 410a in vertical device stack 400a is coupled to substrate 140 while enclosed power device 410b in vertical device stack 400b is coupled to substrate 180. Conversely, conductive spacer 420a in vertical device stack 400a is coupled to substrate 180 while conductive spacer 420b in vertical device stack 400b is coupled to substrate 140.

In some implementations, conductive spacers 420a and 420b may include grooves 421 (e.g., circumferential grooves) in the spacer surfaces that are coupled to power devices 410a, 410b. The vertical device stacks 400a, 400b may be arranged so that the power devices are aligned with the grooves before coupling. The grooves will be described in more detail below at least in connection with FIG. 9.

FIGS. 4 and 5 also show electrical connection leads 430 for device packages 400 and 500. Electrical connection leads 430 can be coupled to substrate 140 and substrate 180 using electrically conductive material (e.g., coupling mechanism 431).

Further, the inter-component coupling mechanisms (i.e., coupling mechanism 312a, coupling mechanism 313a, coupling mechanism 314a, coupling mechanism 312b, coupling mechanism 313b, and coupling mechanism 314b) of vertical device stacks 400a and 400b in device package 400, like the inter-component coupling mechanisms in device package 300, may be solder, sinter or fusion bonds. These coupling mechanisms, which may be made of thermally and electrically conductive material, may, in addition to mechanically coupling the components, provide thermal pathways for cooling the power devices in vertical device stacks 400a, 400b.

FIG. 5 shows an example device package 500 that has the same structure and components as device package 400, but in which coupling mechanism 312a between power device 410a (e.g., an IGBT) and substrate 140 is explicitly shown to be a solder bump coupling mechanism 312as (labelled as 312a/312as in the FIG. 5). FIGS. 4 and 5 also show, for example, use of underfill 311a in device packages 400 and 500 for protecting the coupling mechanism between power device 410a and substrate 140. Such use of underfill materials can be optional in one or more implementations.

As described above, a device package (e.g., a double sided direct cooled power module package) may include more than one semiconductor die enclosed within a pair of opposing substrates. In example implementations, the device package may further include structures (e.g., a conductive pillar) that structurally strengthen the device package. Such strengthening of the device package may help avoid the effects of deformation stress (e.g., thermal deformation stress) on the mechanical and electrical integrity of the device die-substrate coupling mechanisms (e.g., coupling mechanisms 312a and 312b) in the device package.

Figure 6:
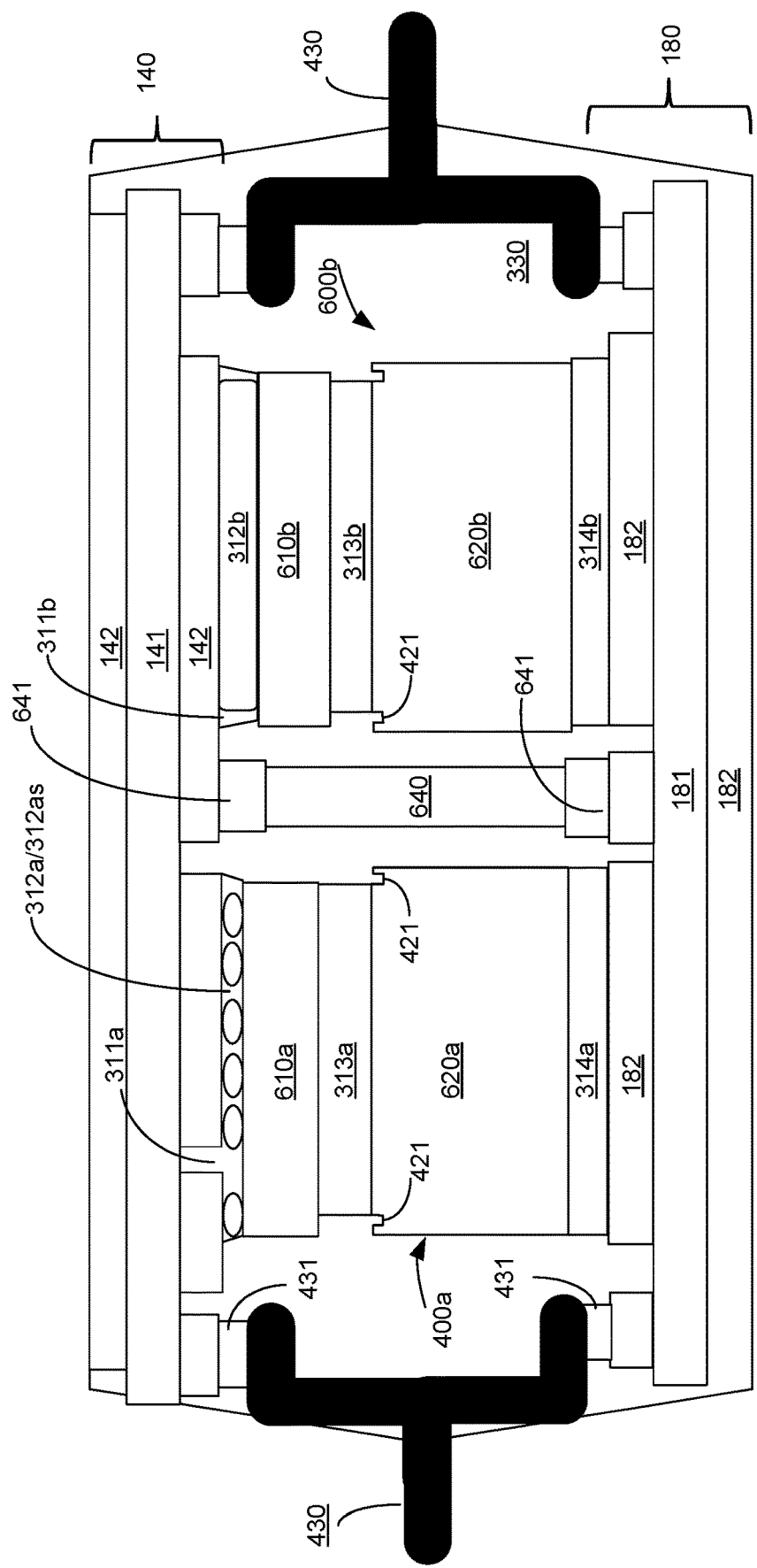
FIG. 6 is a schematic illustration of an example device package that includes supporting structures.

FIG. 6 shows an example device package 600 that includes a conductive pillar 640. Conductive pillar 640 can be configured as an electrical interconnection. In some implementation, conductive pillar 640 can structurally strengthen the configuration of the opposing pair of substrates 140, 180 in the device package 600. In some implementations multiple conductive pillars can be included in the device package 600

Device package 600, like device package 300, includes two semiconductor power devices 610a, 610b enclosed within a pair of opposing substrates 140, 180. In device package 600, vertical device stacks 600a and 600b are arranged so that power device 610a in vertical device stack 600a and power device 610b in vertical device stack 600b are both coupled to substrate 140. Conversely, conductive spacer 620a in vertical device stack 600a and conductive spacer 620b in vertical device stack 600b are both coupled to substrate 180.

Further, as shown in FIG. 6, the inter-component coupling mechanism (i.e., coupling mechanism 312a, coupling mechanism 313a, coupling mechanism 314a, coupling mechanism 312b, coupling mechanism 313b, and coupling mechanism 314b) of the vertical device stacks 600a and 600b in device package 600, like the inter-component coupling mechanisms in device package 300, may be solder, sinter or fusion bonds. In FIG. 6, coupling mechanism 312a between power device 610a (e.g., an IGBT) and substrate 140 is explicitly shown to be a solder bump coupling mechanism 312as (and labelled as 312a/312as in the FIG. 6).

In device package 600, conductive pillar 640 may be disposed between substrate 140 and substrate 180 to support the two substrates apart. Conductive pillar 640 may be disposed along a vertical axis parallel to vertical device stacks 600a and 600b. In example implementations, conductive pillar 640 may be a copper pillar. Opposite ends of conductive pillar 640 may be coupled to the two substrates using coupling mechanisms 641 made of epoxy or solder materials. In some implementations, conductive pillar 640 may help stiffen the device package structures and limit shear deformation stress on the inter-component coupling mechanism 312a and 312b, thereby, limiting a potential risk of stress induced die crack.

In the device packages 400, 500, and 600 described herein, for example, with reference to FIGS. 4 through 6, voids or open spaces in the device packages between components (e.g., between substrate 140, substrate 180, the enclosed vertical device stacks, and conductive pillar 640) may be, like in device package 300, filled with molding material 330 (e.g., a polymer or epoxy) to encapsulate the enclosed components in the device packages.

Further, as noted previously, the power device-to-substrate coupling mechanisms 312a, 312b in the device packages may, for example, be a solder bump, a preform solder, a solder paste, sintering or a fusion bond. These power device-to-substrate coupling mechanisms 312a, 312b do not involve wire bonding and thus may be referred to herein as wire-less couplings. Further, the power devices (e.g., an IGBT) may be coupled to a substrate (e.g., substrate 140 or substrate 180) in a flip chip configuration with or without underfill (e.g., underfill material 311a).

Figure 7:
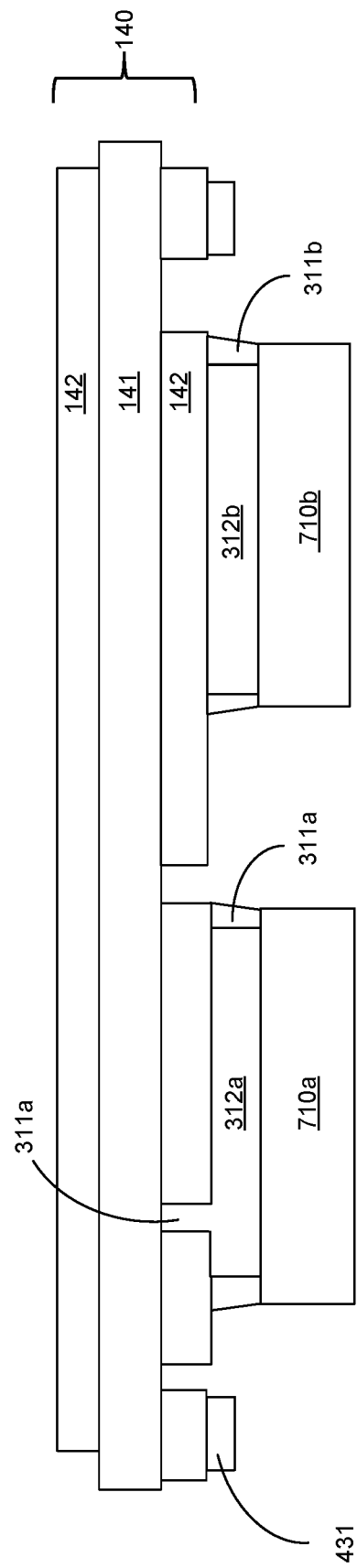
FIG. 7 is a schematic illustration of power devices that are directly bonded or wire-less bonded to a substrate.

FIG. 7 shows, for example, power devices 710a and 710b (e.g., IGBT, FRD, etc.) that are wire-less coupled (i.e., directly coupled) to substrate 140 without use of wire bonding. Device-to-substrate coupling mechanisms 312a and 312b may be formed, for example, by solder paste or fusion bonding. The device-to-substrate coupling mechanisms 312a and 312b of power devices 710a and 710b may optionally include underfill material 311a, 311b.

Figure 8:
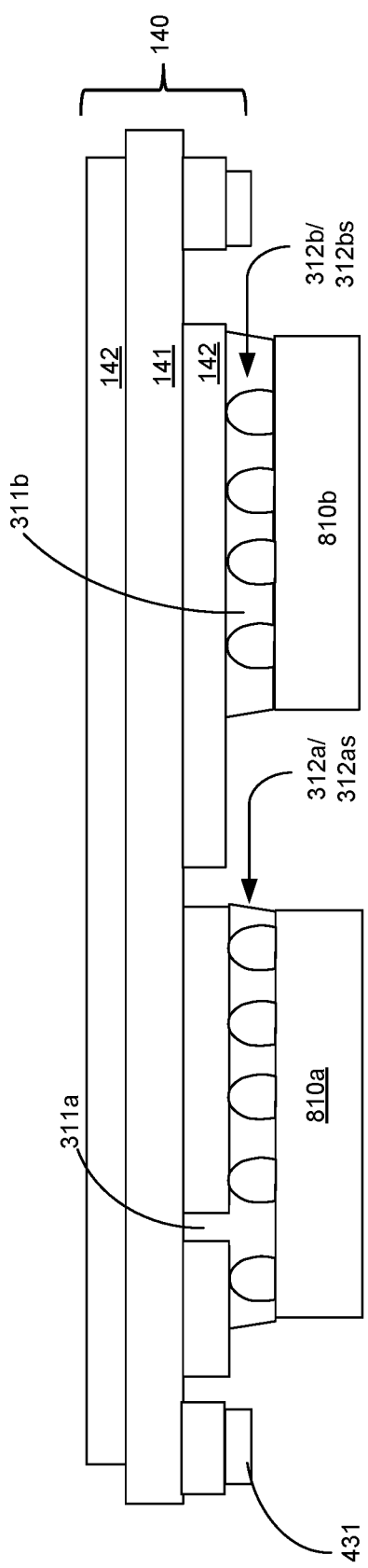
FIG. 8 is a schematic illustration power devices that are directly bonded or wire-less bonded to a substrate.

FIG. 8 shows, for example, power devices 810a and 810b (e.g., IGBT, FRD, etc.) that are directly coupled to substrate 140 without use of wire bonding. Power devices 810a and 810b (e.g., IGBTs) may, for example, be coupled in flip chip configurations (i.e., source down orientations) to substrate 140 using solder bumps and underfill material (e.g., underfill 311a, 311b) to make the device-to-substrate couplings 312a/312as and 312b/312bs.

In example implementations, a conductive spacer used in a vertical device stack enclosed in a device package may have a lateral size (i.e., a width) that is larger than the size (i.e., width) of the power device to which it (the spacer) is coupled. Having conductive spacers (with or without surface grooves) that are wider than power devices may help reduce deformation stress on the power devices that are coupled to the conductive spacers, guide placement and alignment of the power devices in the enclosed vertical stacks in assembly processes, and help in controlling solder volume when forming the device-to-spacer coupling mechanisms.

As noted previously, for example, with reference to FIG. 4, the conductive spacers (e.g., conductive spacer 420a and conductive spacer 420b) used in the device packages described herein may include grooves 421 (e.g., circumferential grooves) in the spacer surfaces that are coupled to the power devices (e.g., power device 410a and power device 410b). These grooves may serve as alignment marks when assembling the vertical device stacks in the device packages. Further, in example implementations, a power device die may have a coupling surface area that is smaller than an area enclosed by the grooves in the spacer surface. In such implementations, the power device die may be placed within the area enclosed by the grooves for coupling with the conductive spacer. The grooves may help contain overflow of solder and other coupling mechanism material when the spacer-to-device coupling mechanisms (e.g., coupling mechanisms 313a, 313b) are formed (using, for example, solder paste).

Figure 9:
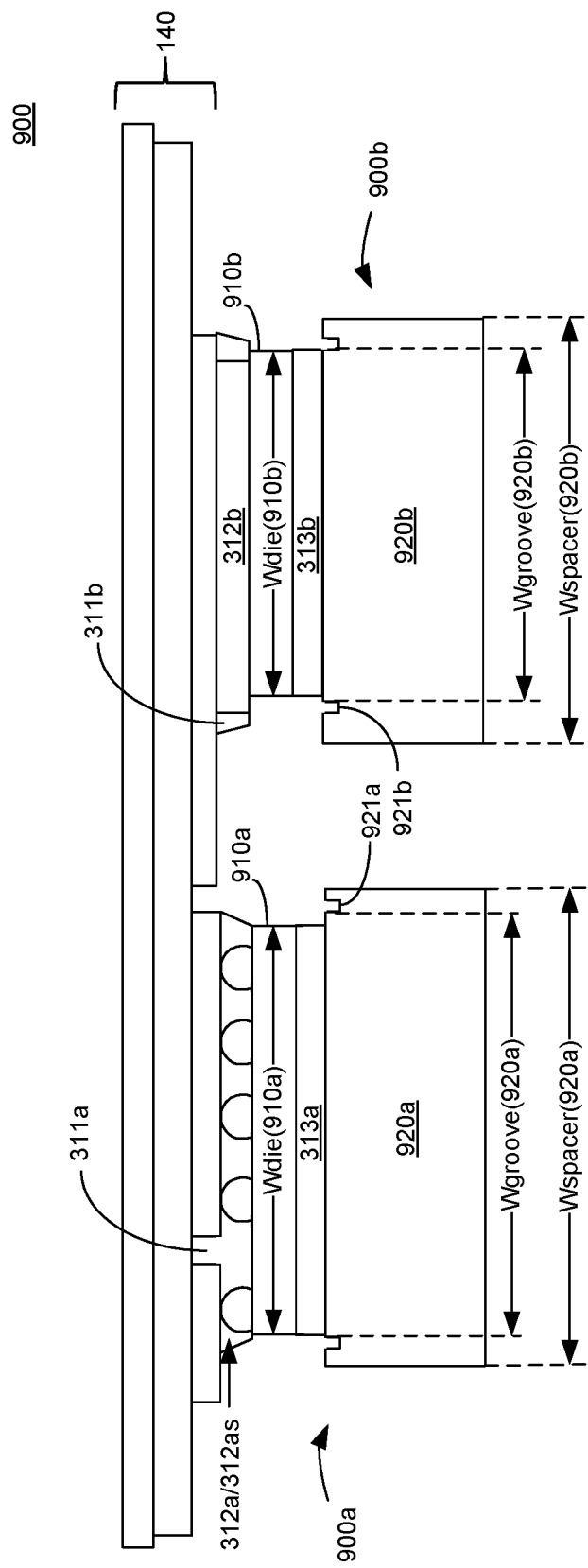
FIG. 9 is a schematic illustration of the relative widths of example conductive spacers and power devices in vertical device stacks enclosed in a device package.

FIG. 9 illustrates, for example, relative widths of the conductive spacers and power devices in vertical device stacks (device stacks 900a and 900b) that may be enclosed in a device package 900. For visual clarity only a portion of device package 900 is shown in FIG. 9.

Device stack 900a may include a power device die 910a coupled to substrate 140 in a flip chip configuration (i.e., a source down orientation) by coupling mechanism 312a/312as and to a conductive spacer 920a by coupling mechanism 313a. Similarly, device stack 900b may include a power device die 910b coupled to substrate 140 by coupling mechanism 312b and to a conductive spacer 920b by coupling mechanism 313b. Conductive spacer 920a may include a groove 921a and conductive spacer 921b may include a groove 921b in their spacer surface that is coupled to the power devices.

The sizes of the components in device package 900 may be characterized by their widths. For example, power device die 910a may have a lateral width, Wdie (910a). Similarly conductive spacer 920a may have a lateral width, Wspacer (920a). A coupling surface area enclosed by groove 921a can be characterized by a width Wgroove (920a). Similarly, power device die 910b may have a lateral width, Wdie (910b); conductive spacer 920b may have width Wspacer (920b); and a coupling surface area enclosed by groove 921b may be characterized by a width Wgroove (920b). In the example implementation of package 900 shown in FIG. 9, conductive spacer 920a naturally has a width greater than the width of the coupling surface area enclosed by groove 921a, and the width of the coupling surface area enclosed by groove 921b may be greater than the width of power device die 910a. In other words, Wspacer (920a)>Wgroove (920a) >Wdie (910a). Similarly, for the example implementation shown in FIG. 9, Wspacer (920b)>Wgroove (920b)>Wdie (920b).

When assembling vertical device stacks 900a and 900b, placing the narrower width (Wdie) power device dies within the wider width (Wgroove) grooves in the conductive spacer surfaces may help guide placement and alignment of the power device dies in the vertical stacks, and help in controlling solder volume when forming the device-to-spacer bonds (e.g., coupling mechanism 313a and coupling mechanism 313b).

Further, bonding a power device die to a larger size conductive spacer (with or without the grooves) can leave ledges (i.e., edges portions of the conductive spacer extending laterally (horizontally) beyond edges of the power device die) in the vertical device stack. Such a structural configuration (i.e., using larger or wider size conductive spacers) can mitigate die crack risk during thermal cycling (TMCL) of the device packages.

In example implementations, the device dies (e.g., power device 310*a* and power device 310*b*, power device 410*a* and power device 410*b*, etc.) used in the vertical device stacks in the device packages may have rectangular shapes with rounded corners. Further, the conductive spacers (e.g., spacers 320*a* and spacer 320*b*, spacers 420*a* and spacer 420*b*, etc.) to which the device dies are coupled may also have rectangular shapes with rounded corners.

FIGS. 10A through 10F pictorially show examples of different rectangular shapes with rounded corners of an example device 1001, and different rectangular shapes (with and without rounded corners) of an example conductive spacer 1002. Conductive spacer 1002 may have a circumferential groove 1003 on a surface on which device die 1001 may be coupled (by coupling mechanism 1004, which may be a solder bond or a sinter bond).

FIG. 10A shows, for example, in cross sectional view, device die 1001 coupled, via coupling mechanism 1004, to conductive spacer 1002. Device 1001 may be placed within circumferential groove 1003 so that outer portions of the surface of conductive spacer 1002 on which device die 1001 is coupled to form a ledge 1005 (extending from the edges of device 1001 to the edges of conductive spacer 1002).

FIGS. 10B through 10F show, in plan view, the relative geometries of various combinations of device 1001 (having different shapes with rounded corners), conductive spacer 1002 (having different shapes with and without rounded corners), circumferential groove 1003, and ledge 1005.

As noted previously, use of a device die with rounded edges and the formation of ledges extending beyond device die may mitigate risk of crack damage to the device die during thermal cycling (TMCL) of the device package. The device package may also have a potential risk of crack formation due a mismatch of thermal expansion coefficients (TCE) of the conductive spacers (e.g., copper spacers) and the molding or encapsulant material (molding material 330) used in the device package. The use of rounded conductive spacers (e.g., conductive spacer 1002 shown, for example, in FIGS. 10B, 10D and 10E) may mitigate risk of crack damage at conductive spacer-encapsulant material interfaces during thermal cycling (TMCL) of the device package.

In example implementations, the concept of using rounded shapes for the conductive spacers may be extended to other components of the device packages. For example, supporting pillars (e.g., conductive pillar 640) used in the device packages (e.g., device package 600) may have a rounded cross sectional shape.

Figure 11:
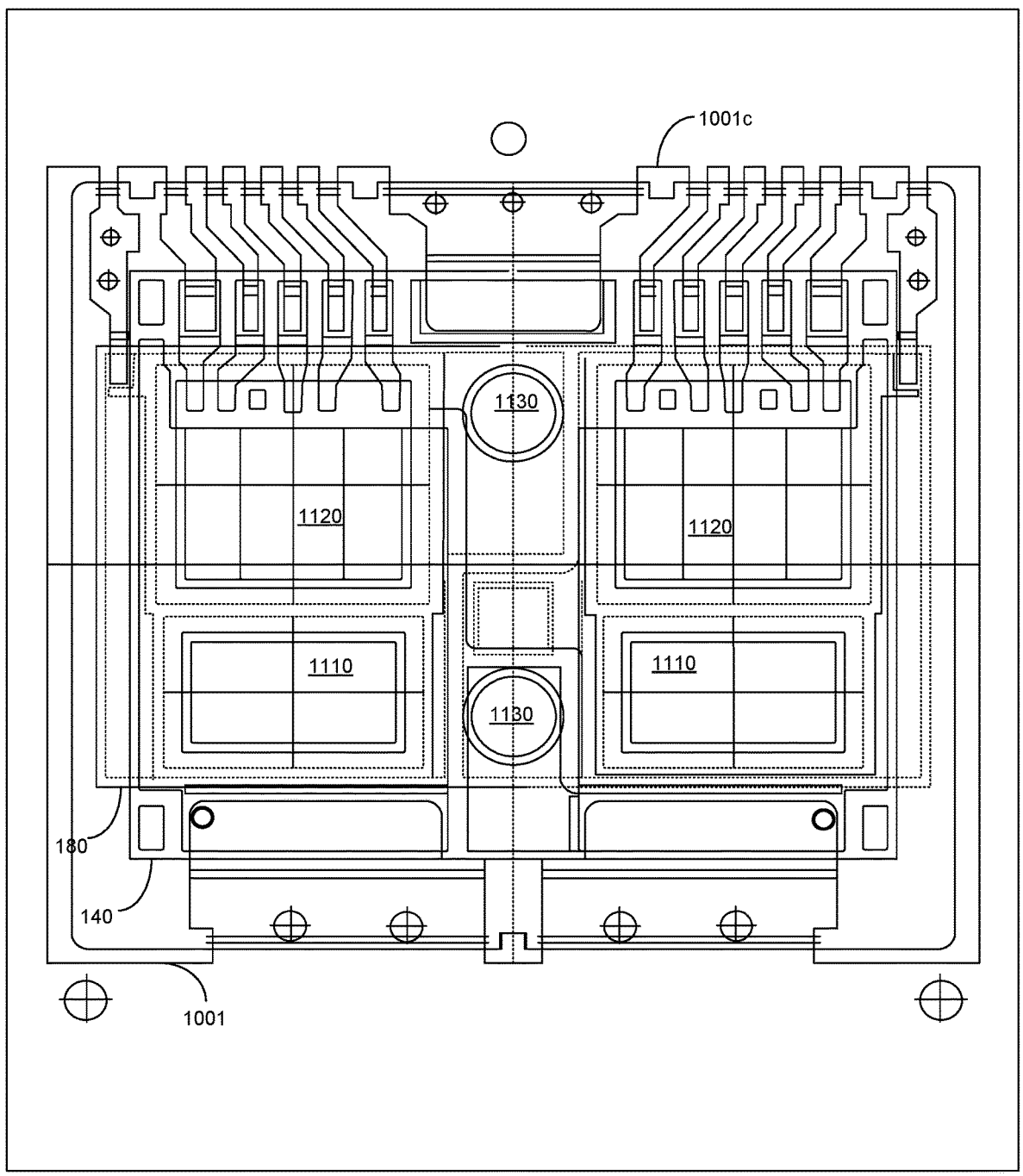
FIG. 11 is a schematic illustration of rounded shape components used in a package.

FIG. 11 shows an example of the use of rounded shape components in a package 1100. Package 1100 may include a leadframe 1001 (with terminals 1001*c*). Leadframe 1001 may hold a pair of opposing direct bonded metal (DBM) substrates 140, 180 enclosing vertical device stacks 1110, 1120 of power devices and conductive spacer combinations. In the package 1100, the components enclosed between substrate 140 and substrate 180 may also include supporting structures (e.g. conductive pillars 1130) that like conductive pillar 640 (used in device package 600) may have a rounded cross sectional shape.

In addition to mitigating risk of crack formation in TMCL, use of rounded components (e.g., round shape conductive spacers, conductive pillars and interconnections) may ease flux cleaning and molding material flows in assembly processes, when compared to the use of sharp cornered components.

The dimensions of the components, the materials and the methods of assembling the device packages can result in device packages having low thermal mechanical stress structures.

FIG. 12A shows an example IGBT die 1201. IGBT die 1201 may include a plurality of IGBT devices (e.g., device 1204-1, device 1204-2, device 1204-3, and device 1204-4) and other devices (e.g., device 1203-1, device 1203-2, device 1203-3, device 1203-4, device 1203-5, device 1203-6, and device 1203-7) formed on a semiconductor substrate 1202. These other devices may, for example, include signal conditioning circuits, I/O devices, timing circuits, etc. In example implementations, IGBT die 1201 may have a generally rectangular shape with side dimensions in the thousands or tens of thousands of microns. In an example implementation, IGBT die 1201 may, for example, be a rectangle with dimensions of about 15000 µm×15000 µm, and the IGBT devices (e.g., device 1204-1, device 1204-2, device 1204-3, and device 1204-4) may have dimensions of about 3000 µm×11000 µm.

In example implementations, IGBT die 1201 may be used as device die 610*a* in assembling device package 600 (FIG. 6).

FIG. 12B shows an example FRD die 1205. FRD die 1205 may include an FRD device 1207 formed on a semiconductor substrate 1206. In example implementations, FRD die 1205 may have a generally rectangular shape with side dimensions in the thousands or tens of thousands of microns. In an example implementation, FRD die 1205 may, for example, be a rectangle with dimensions of about 8500 µm×14000 µm, and the FRD device 1207 may have dimensions of about 7000 µm×12500 µm.

In example implementations, FRD die 1205 may be used as device die 610*b* in assembling device package 600 (FIG. 6).

FIGS. 13-24 illustrate example processes and sub-processes for assembling the device packages (e.g. device package 600) that provide dual side cooling to enclosed power devices.

The processes for assembling device package 600 may, for example, include a process for preparation of substrate 140 (e.g., by coupling device dies 610*a* and 610*b* to a first DBM substrate 140), a process for preparation of substrate 180 (e.g., by coupling conductive spacers 620*a* and 620*b* to a second DBM substrate 180), a process for aligning the first DBM substrate 140 upside down over the second DBM substrate 180, and a process for coupling device dies 610*a* and 610*b* on the first DBM substrate 140 to conductive spacers 620*a* and 620*b* on the second DBM substrate 180 to obtain device package 600. Press jigs can be used to assemble and hold the various components together through the assembly processes.

Figure 13:
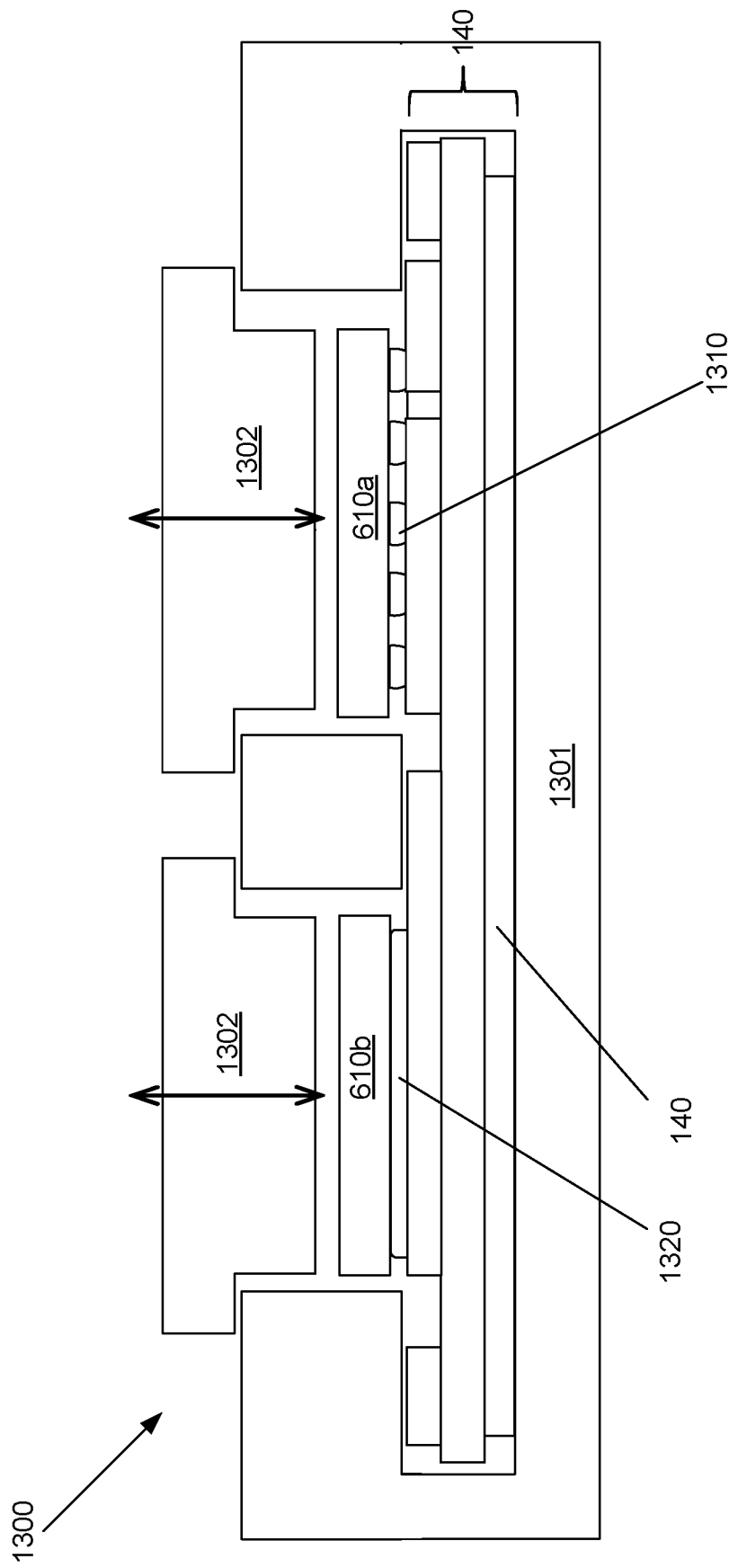
FIGS. 13 through 24 are schematic illustrations of example processes for assembling a device package with dual side cooling for enclosed power devices.
Figure 14:
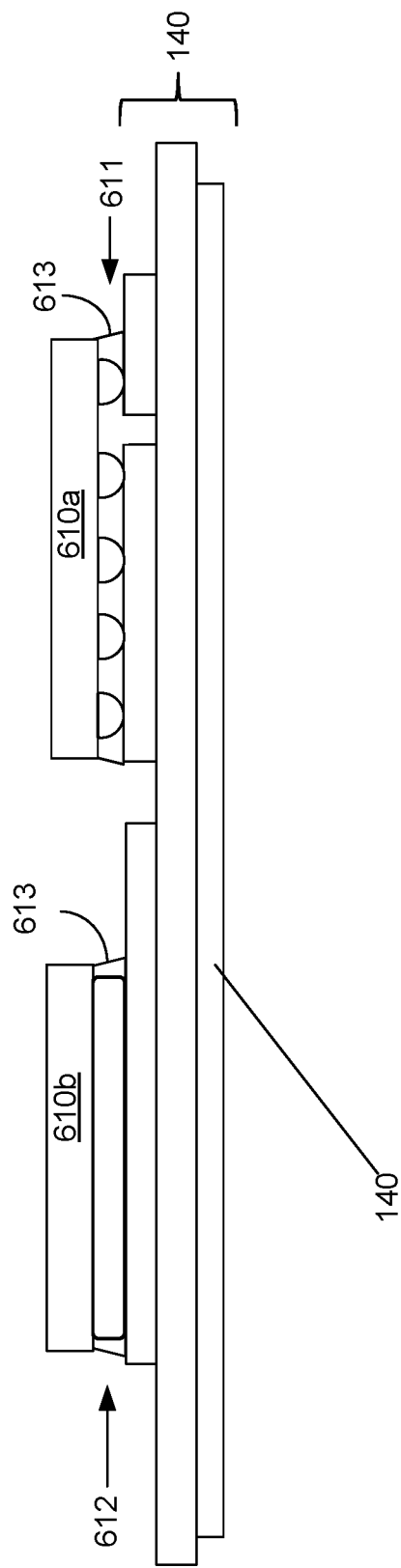
Figure 15:
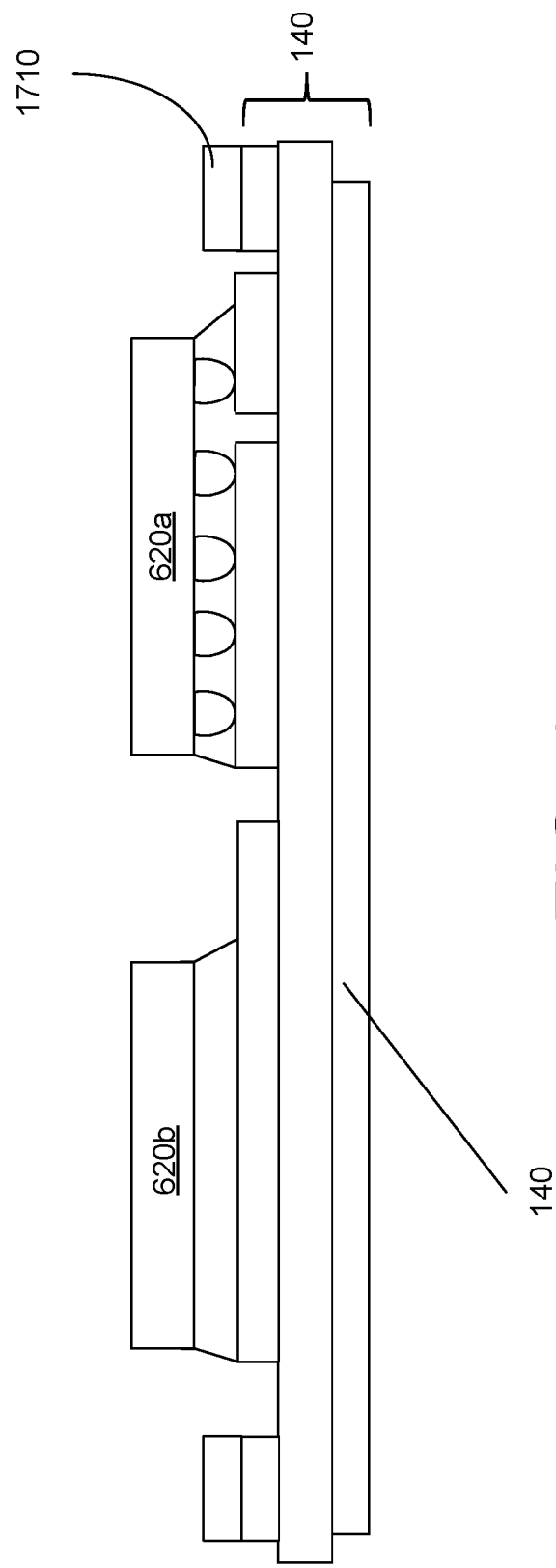
Figure 21:
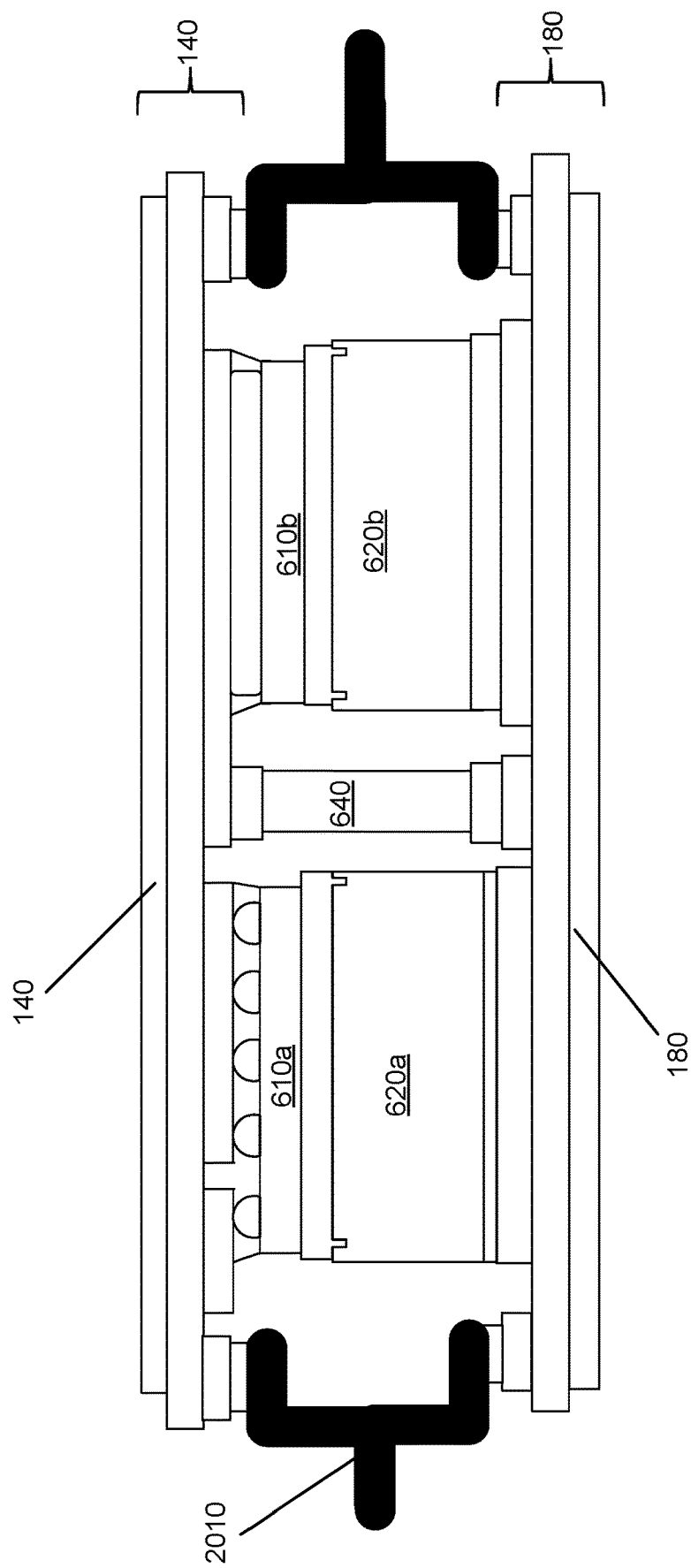
Figure 22:
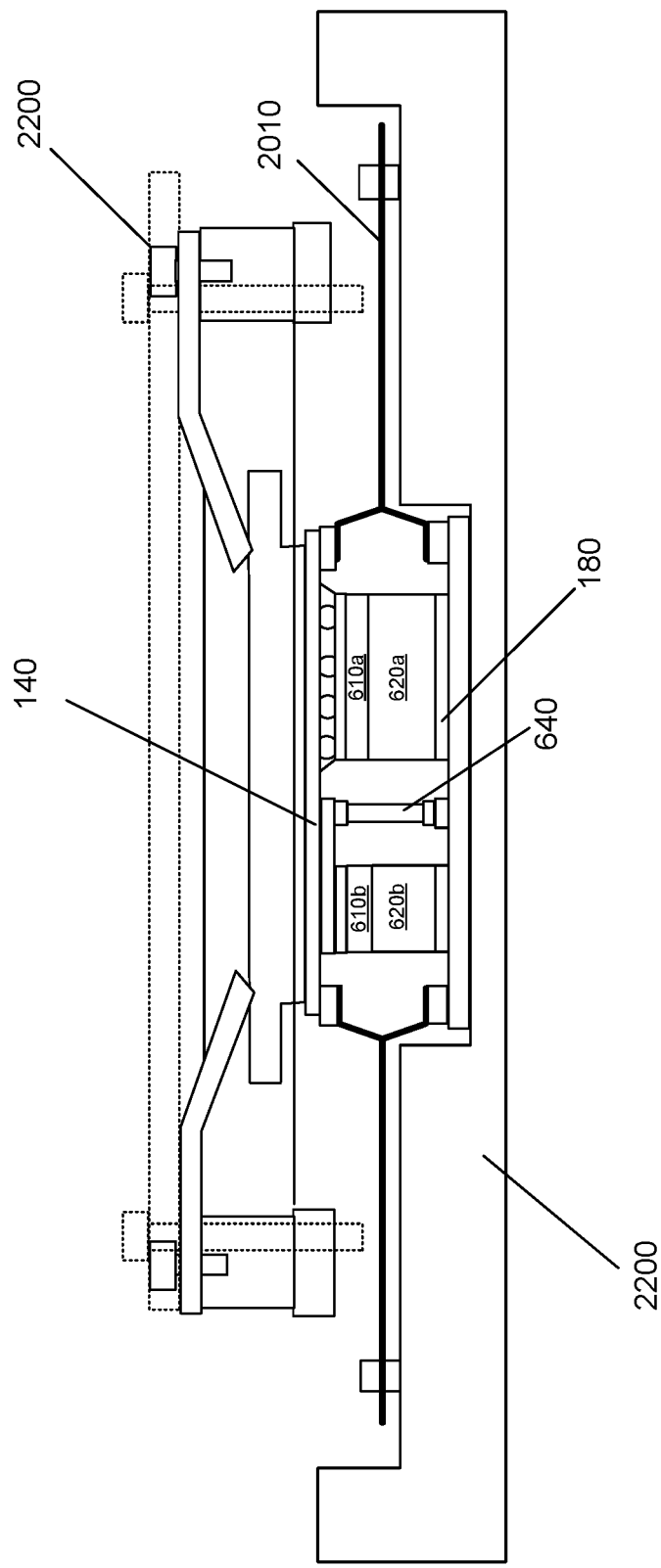

FIGS. 13 through 15 show the process for preparation of substrate 140, while FIGS. 16 through 20 show the process for preparation of substrate 180. FIGS. 21 and 22 show the process of aligning the first DBM substrate 140 upside down over the second DBM substrate 180.

FIG. 13 shows an example press jig 1300 that can be used in the preparation of substrate 140. Press jig includes a carrier 1301 and presses 1302. In an example substrate preparation process, the first DBM substrate 140 having solder bumps 1310 and preform solder 1320 can be placed in carrier 1301 to couple device dies 610*a* and 610*b* to the first DBM substrate 140. Device die 610*a* (e.g., IGBT die

1201, FIG. 12A, in a flip chip configuration) and device die 610b (e.g., FRD die 1205, FIG. 12B) can be aligned and placed over solder bumps 1310 and preform solder 1320 (using, e.g., presses 1302 for alignment and placement). In example implementations, substrate 140 may be a printed dual sided circuit board with a NiP/Au (ENIG) finish on surfaces. Reflow soldering may be used to couple device die 610a and device die 610b to substrate 140. In example implementations, to ensure voiding and interface bonding between solder and the ENIG finish on surfaces of substrate 140, vacuum reflow using formic acid can be used for the reflow soldering.

As shown in FIG. 14, the reflow soldering may create coupling mechanism 611 between device die 610a and substrate 140, and coupling mechanism 612 between device die 610b and substrate 140. The coupling mechanisms may be protected by underfill 613. Alternatively, the underfill may be omitted and later replaced with mold underfill for protection of device package 600.

FIG. 15 illustrates a next stage in the preparation of substrate 140. In this next stage, a solder paste 1710 may be dispensed over substrate 140 (having device die 610a and device die 610b coupled to it, FIG. 14). With solder paste 1710 on it, substrate 140 is ready to be aligned upside down over the second DBM substrate 180 (as shown in FIG. 21).

Figure 16:
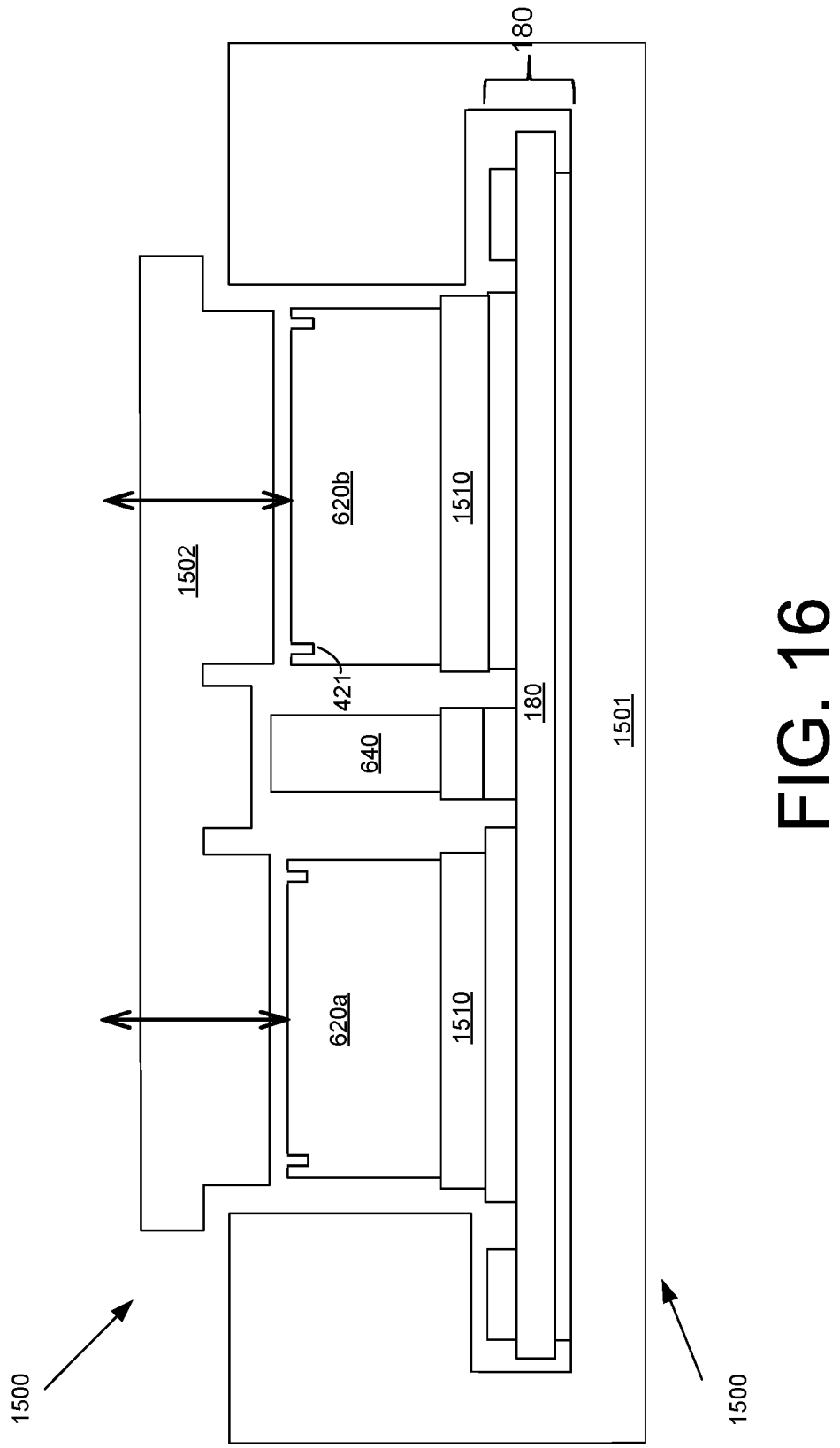

FIG. 16 shows an example press jig 1500 that can be used in the preparation of substrate 180. Press jig 1500 includes a carrier 1501 and a press 1502. For coupling spacers 620a and 620b to the second DBM, the second DBM substrate 180 with preform solder 1510 on it is placed in carrier 1501. Spacers 620a and 620b are aligned and placed over preform solder 1510. Spacers 620a and 620b may have coupling surfaces that, for example, have grooves (e.g., grooves 421) therein. Further, a supporting conductive pillar 640 may also be aligned and placed over preform solder 1510 (using, e.g., press 1502 for alignment and placement).

Figure 17:
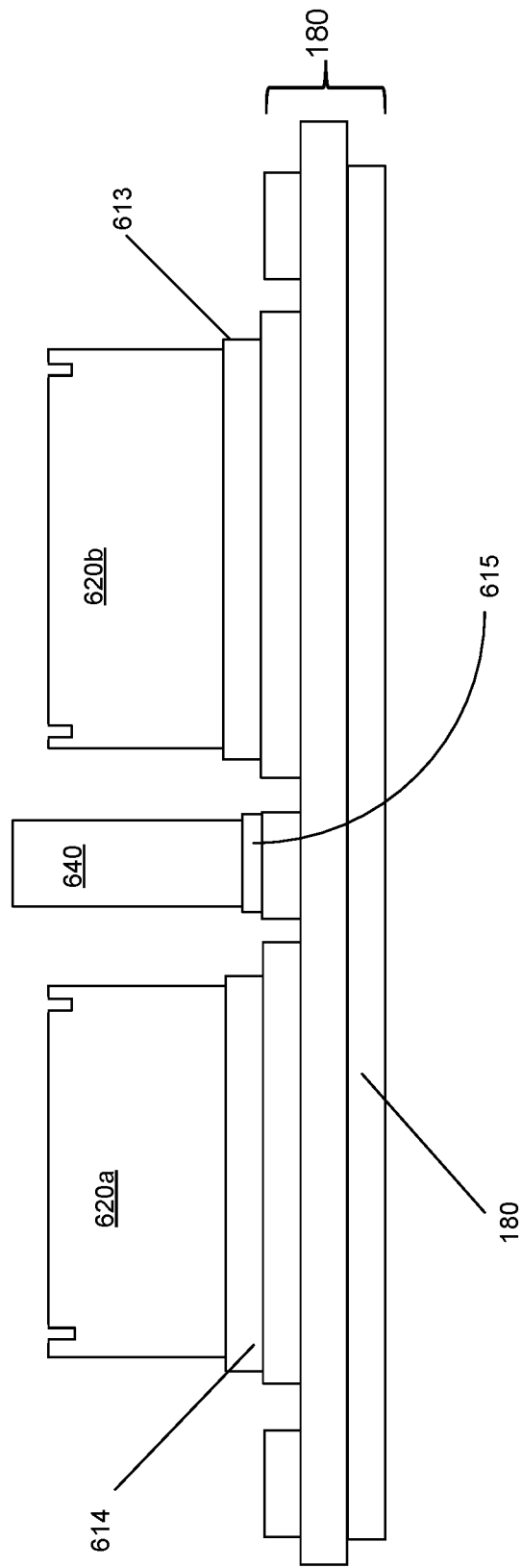

Reflow soldering can be used to couple spacer 620a, spacer 620a and conductive pillar 640 to substrate 180. As shown in FIG. 17, the reflow soldering may create a coupling mechanism 614 between spacer 620a and substrate 180, a coupling mechanism 613 between spacer 620b and substrate 180, and a coupling mechanism 615 between conductive pillar 640 and substrate 180.

Figure 18:
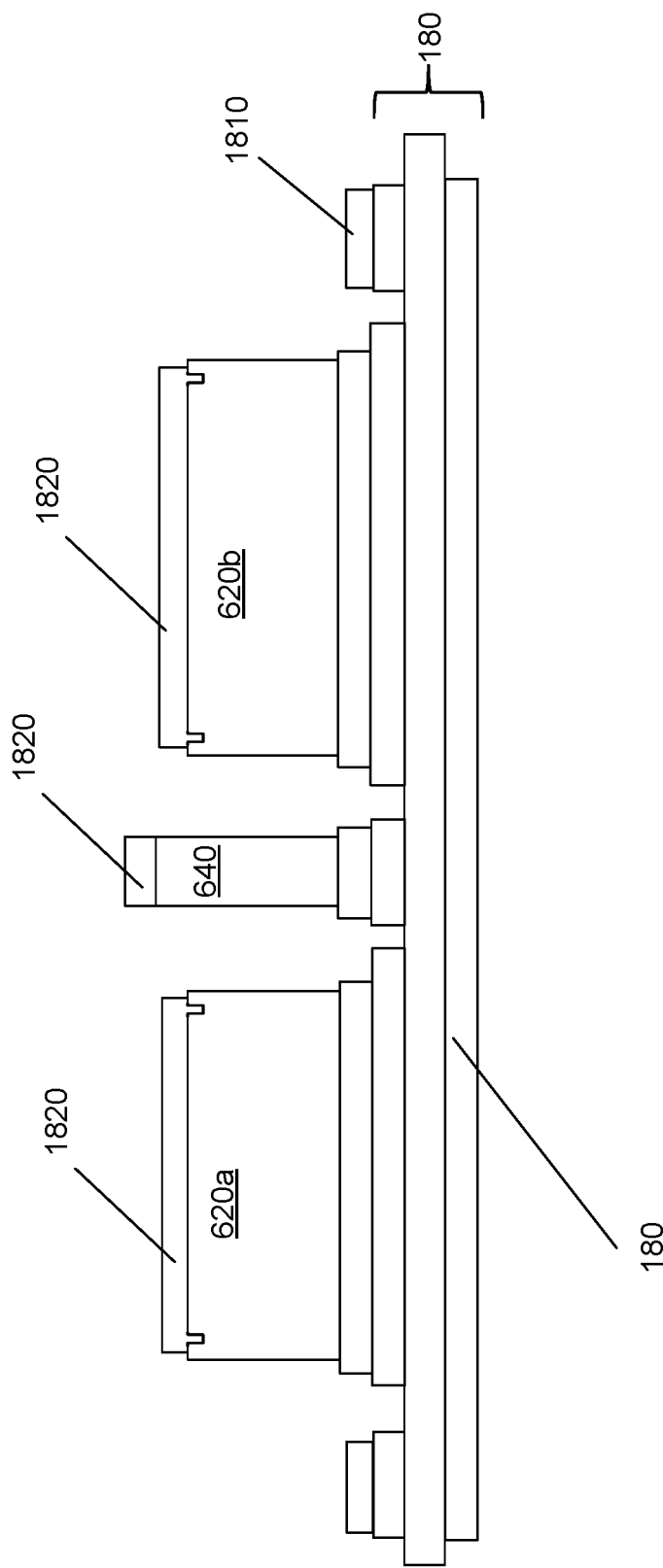
Figure 19:
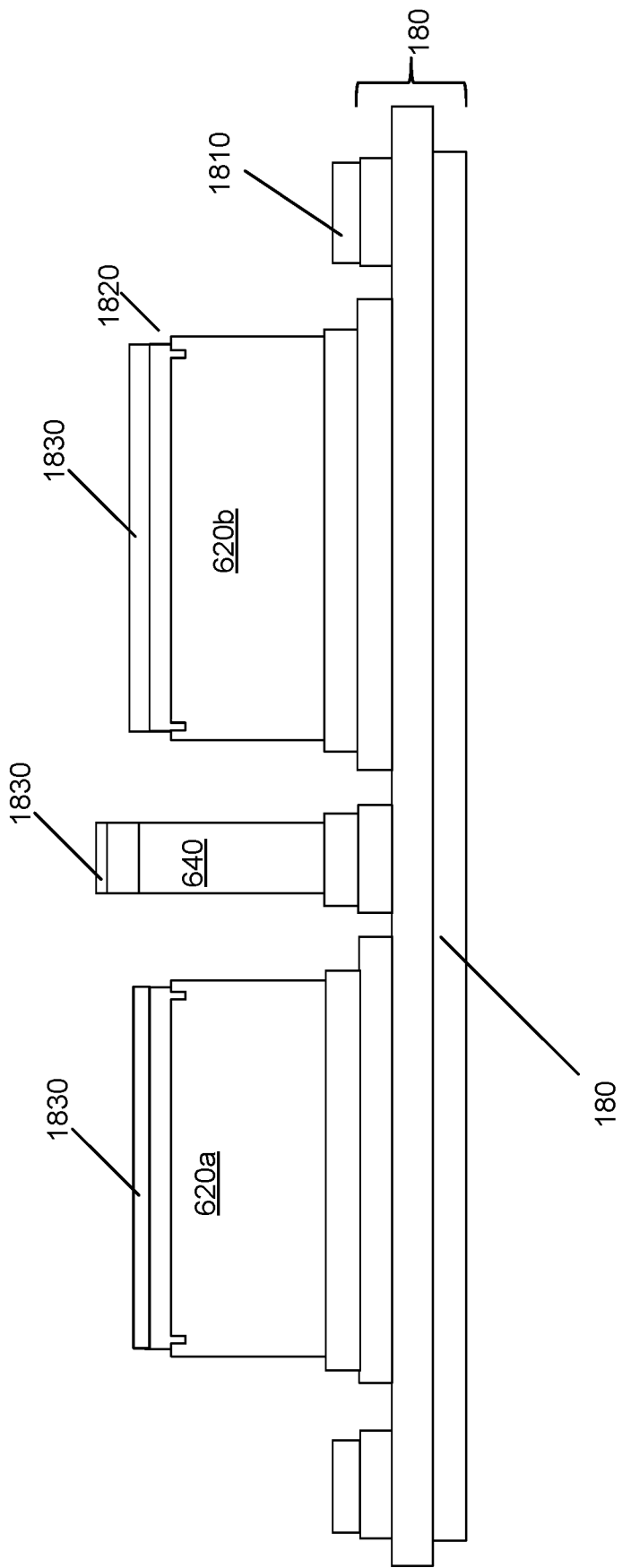
Figure 20:
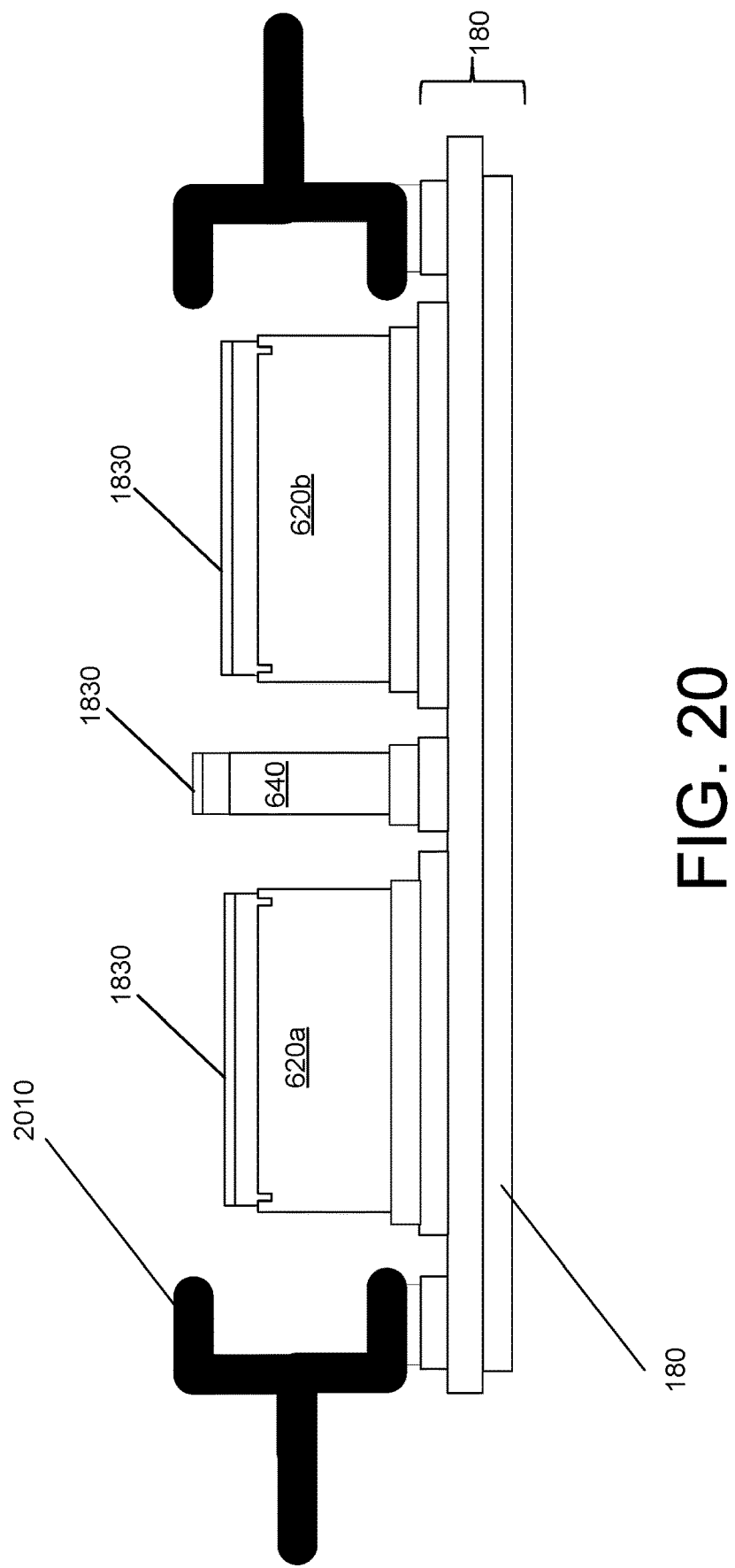

FIGS. 18 through 20 illustrate the next stages in the preparation of substrate 180. As shown in FIG. 18, in a next stage, a solder paste 1810 may be dispensed on substrate 180, and a solder sheet 1820 may be applied over spacer 620a, spacer 620b and conductive pillar 640 (which are coupled to substrate 180, FIG. 17). Further, FIG. 19 illustrates a layer of flux 1830 printed on the structures of substrate 180 (FIG. 18), and FIG. 20 illustrates a leadframe 2010 (for package 600) attached to substrate 180 using a support jig (not shown).

At this stage of the assembly processes, substrate 180 is ready for receiving prepared substrate 140 aligned upside down over substrate 180 (as shown in FIG. 21).

FIG. 21 illustrates prepared substrate 140 (FIG. 15) that is flipped upside down and placed on top of prepared substrate 180 (FIG. 20) with the structures (e.g., device die 610a and device die 610b) that are coupled to substrate 140 aligned with the structures (e.g., spacer 620a, spacer 620b and conductive pillar 640, leadframe 2010) that are coupled to substrate 180.

As shown in FIG. 22, a jig 2200 may be used to hold the combined assembly of the flipped-upside-down substrate 140 and substrate 180 (FIG. 21). Reflow soldering may be used to create coupling mechanisms between the structures of substrate 140 (e.g., device die 610a, device die 610b, substrate 140 itself) and the structures of substrate 180 (e.g., spacer 620a, spacer 620b, conductive pillar 640, and leadframe 2010).

Figure 23:
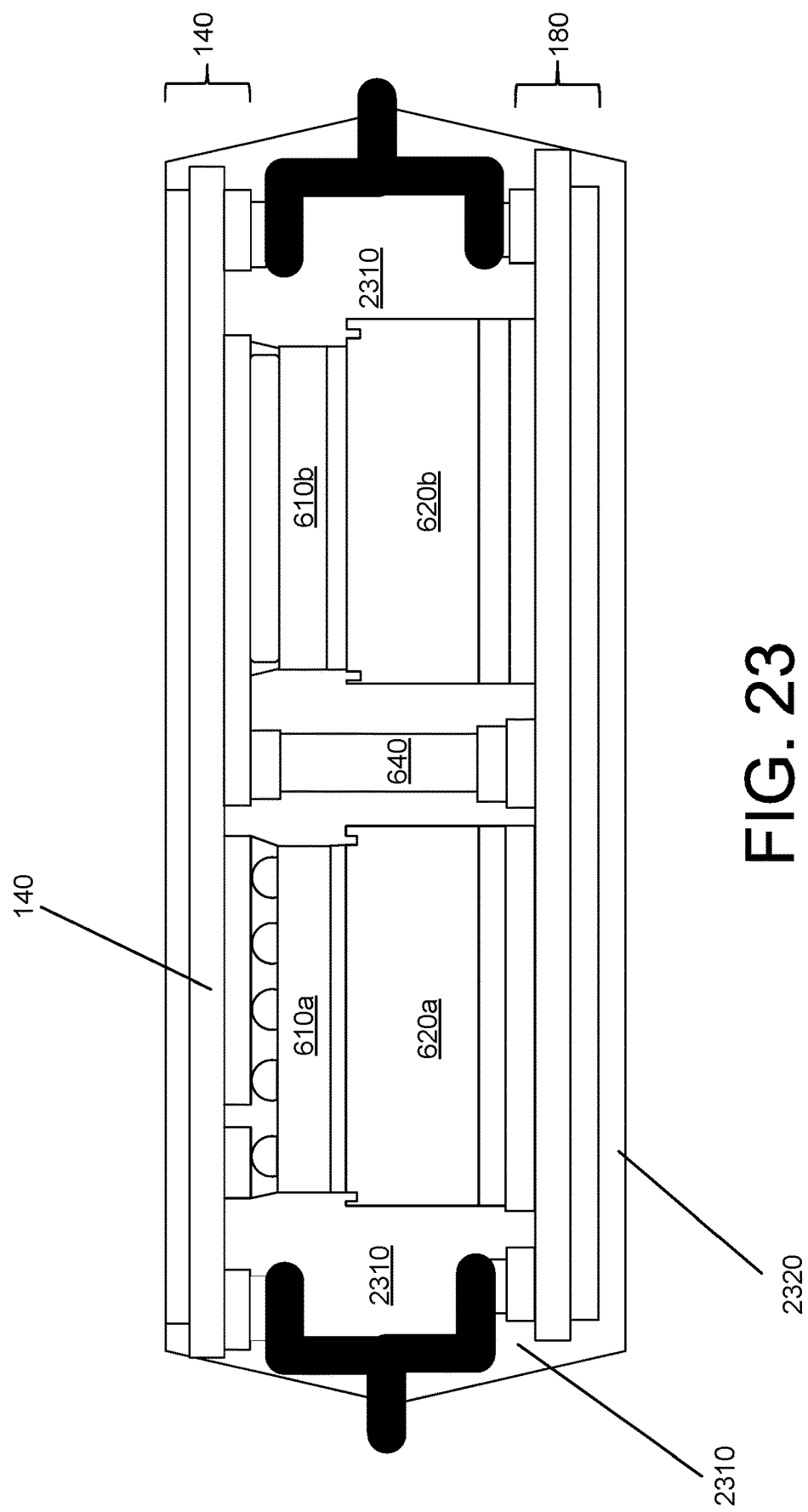
Figure 24:
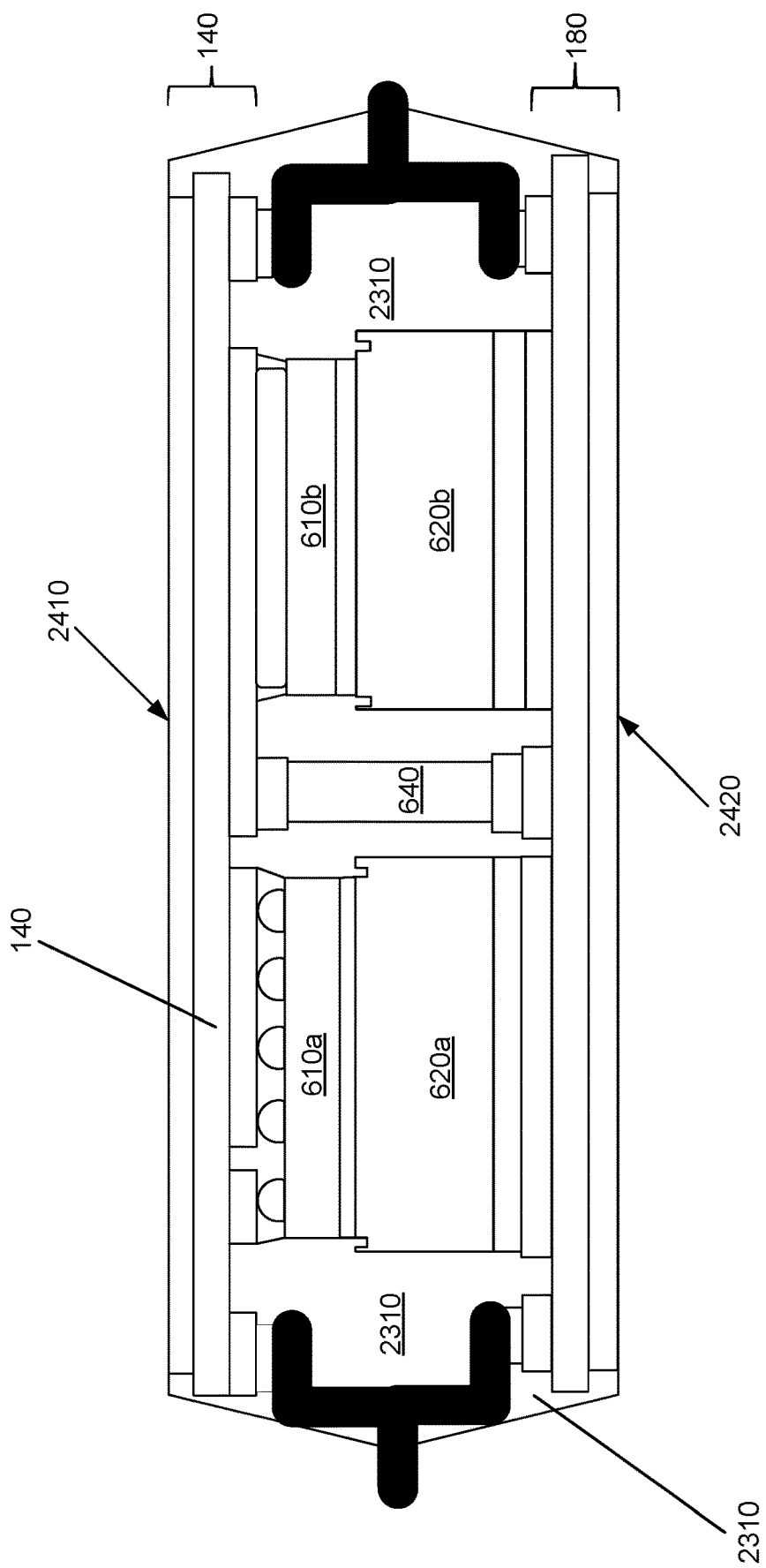

After flux cleaning, as shown in FIG. 23, molding material 2310 may be used to encapsulate the structures on substrate 140 and substrate 180 to form device package 600. A vacuum molding process may be used for the encapsulation. The vacuum molding process may leave excess molding 2320, for example, on the bottom of substrate 180. This excess molding may be removed, for example, by grinding, to obtain the final encapsulated device package (e.g., device package 600), as shown in FIG. 24.

A metal surface of substrate 140 may define a first outer surface 2410 of the dual-side cooling package and a metal surface of substrate 180 may define a second outer surface 2420 of the dual-side cooling package.

In example implementations molding material 2310 may be an encapsulation material (electrically isolating material) used to encapsulate the structures between substrate 140 and substrate 180.

In an example implementation, the structures on prepared substrate 140 (FIG. 15) may be encapsulated using a first electrically isolating material, and the structures on prepared substrate 180 (FIG. 20) may be encapsulated using a second electrically isolating material, before the subcomponents (e.g., substrates) are combined (FIG. 21).

The first and second electrically isolating materials may include molding or potting compounds, pastes or epoxies, The first electrically isolating material may be applied to fill spaces between substrate 140 and structures thereon (e.g., semiconductor die, conductive spacers). The second electrically isolating material may be applied to fill the spaces between substrate 180 and the structures thereon (e.g., conductive spacers, semiconductor die). In example implementations, full encapsulation of device package 600 may be performed in stages during the assembly of device package 600 (e.g., during preparation of substrate 140 (FIG. 17), during preparation of substrate 180 (FIG. 20), or during combination of prepared substrates 140 and prepared substrate 180 (FIGS. 21, 22).

In example implementations, the conductive spacers (e.g., spacer 620a, spacer 620b) used in device package 600 may be made of electrically and thermally conductive material (e.g. copper, aluminum, or metallic alloys).

In example implementations, substrate 140 and 180 may high voltage (e.g., >400V) isolation carriers (e.g., a high voltage direct bonded metal (DBM) substrate, isolated material substrate (IMS) or equivalent substrate).

In example implementations, the first semiconductor die and the second semiconductor die may include at least an IGBT, at least one FRD, or other power devices or combination, such as silicon carbide (SiC), Gallium Nitride (GaN), metal-oxide-semiconductor field effect transistor MOSFET, etc.

In example implementations, the electrically and thermally conductive components (e.g., conductive spacers, conductive pillars) in the device packages may be used as electrical interconnections in the device packages.

In example implementations, semiconductor die with rounded shapes may be semiconductor die with chamfered edges or corners.

Specific structural and functional details disclosed herein are merely representative for purposes of describing example embodiments. Example embodiments, however, be embodied in many alternate forms and should not be construed as limited to only the embodiments set forth herein.

FIG. 25 shows an example method 2500 for packaging semiconductor power devices in a dual-side cooling package (e.g., package 600), in accordance with the principles of the present disclosure. The semiconductor power devices (e.g., IGBTs, FRDs, MOSFETs, etc.) may be devices contained in semiconductor die. For example, a first semiconductor die and a second semiconductor die may contain a first semiconductor power device and a second semiconductor power device, respectively.

Method 2500 includes disposing a first semiconductor die and a second semiconductor die between a first direct bonded metal (DBM) substrate and a second DBM substrate (2510). A metal surface of the first DBM substrate may define a first outer surface of the dual-side cooling package and a metal surface of the second DBM substrate may define a second outer surface of the dual-side cooling package. The first semiconductor die and the second semiconductor die may, for example, contain an IGBT and a FRD, respectively. Disposing the first semiconductor die between the first DBM substrate and the second DBM substrate 2510 may include disposing at least one IGBT device. Disposing the second semiconductor die between the first DBM substrate and the second DBM substrate 2510 may include disposing at least one FRD device.

Method 2500 further includes thermally coupling the first semiconductor die to the first DBM substrate (2520), disposing the first conductive spacer between first semiconductor die and the second DBM substrate (2530), and thermally coupling the first conductive spacer to first semiconductor die and to the second DBM substrate (2540). The first semiconductor die and the first conductive spacer may form a first vertical stack (device stack) between the first DBM substrate and the second DBM substrate.

Method 2500 further includes disposing a second conductive spacer between the first DBM substrate and the second DBM substrate (2550), and thermally coupling the second conductive spacer to the second semiconductor die (2560). The second semiconductor die and the second conductive spacer may form a second vertical stack (device stack) between the first DBM substrate and the second DBM substrate.

Method 2500 further includes thermally coupling one of the second semiconductor die and the second conductive spacer to the first DBM substrate and thermally coupling the other of the second semiconductor die and the second conductive spacer to the second DBM substrate (2570). In an example implementation, method 2500 may include coupling the second conductive spacer to the first DBM substrate. In an example implementation, method 2500 may include coupling the second conductive spacer to the second semiconductor die.

In example implementations, method 2500 may further include disposing a supporting pillar (e.g., a conductive pillar) extending from the first substrate to the second substrate in the package. The supporting pillar may, for example, be made of copper.

Some implementations of the packages described herein may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), and/or so forth.

The terminology used herein is for the purpose of describing particular implementations only and is not intended to be limiting of the implementations. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Example implementations of the present inventive concepts are described herein with reference to cross-sectional illustrations that are schematic illustrations of idealized implementations (and intermediate structures) of example implementations. As such, variations from the shapes of the illustrations as a result, for example, of manufacturing techniques and/or tolerances, are to be expected. Thus, example implementations of the present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example implementations.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present implementations.

Unless otherwise defined, all terms (including technical and scientific terms) used herein have the same meaning as commonly understood by one of ordinary skill in the art to which this present inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A package, comprising:
    a semiconductor die disposed between a first high voltage isolation carrier and a second high voltage isolation carrier, the semiconductor die being thermally coupled to the first high voltage isolation carrier;
    a first molding material disposed in a space between the semiconductor die and the first high voltage isolation carrier;
    a conductive spacer disposed between the semiconductor die and the second high voltage isolation carrier, the conductive spacer thermally coupled to semiconductor die and to the second high voltage isolation carrier, wherein a longitudinal dimension of the conductive spacer is greater than a longitudinal dimension of the semiconductor die; and
    a second molding material encapsulating the first molding material and the conductive spacer.

2. The package of claim 1, wherein the semiconductor die is thermally coupled to the first high voltage isolation carrier in a flip chip configuration by at least one of a solder bump, a preform solder, a solder paste, sintering or a fusion bond.

3. The package of claim 1, wherein a surface of the conductive spacer includes a circumferential groove and the semiconductor die is coupled to the surface of conductive spacer within the circumferential groove.

4. The package of claim 1, wherein the conductive spacer has a rectangular shape with rounded corners.

5. The package of claim 1, wherein the semiconductor die has a rectangular shape with rounded corners.

6. The package of claim 1, wherein at least one of the first high voltage isolation carrier or the second high voltage isolation carrier is a direct bonded metal (DBM) substrate.

7. The package of claim 1, wherein at least one of the first molding material or the second molding material is an encapsulation material.

8. The package of claim 1, wherein at least one of the first molding material or the second molding material is an electrically isolating encapsulation material.

9. The package of claim 1, wherein the conductive spacer is an electrically and thermally conductive spacer.

10. A package, comprising:
    a first direct bonded metal (DBM) substrate, a metal surface of the first DBM substrate defining a first outer surface of the package;
    a second DBM substrate, a metal surface of the second DBM substrate defining a second outer surface of the package; and
    a first vertical stack within the package including:
        a first semiconductor die disposed between the first DBM substrate and the second DBM substrate, the first semiconductor die being thermally coupled to the first DBM substrate; and
        a first conductive spacer disposed between the first semiconductor die and the second DBM substrate, the first conductive spacer being thermally coupled to the first semiconductor die, the first conductive spacer being thermally coupled to the second DBM substrate by a coupling layer, the coupling layer being at least one of a solder, a solder bump, a preform solder, a solder paste, a sinter or a fusion bond,
        wherein a longitudinal dimension of the first conductive spacer is greater than a longitudinal dimension of the first semiconductor die; and
    a second vertical stack within the package including:
        a second semiconductor die and a second conductive spacer disposed between the first DBM substrate and the second DBM substrate, the second semiconductor die being thermally coupled to the second conductive spacer, one of the second semiconductor die or the second conductive spacer being thermally coupled to the first DBM substrate and the other of the second semiconductor die and the second conductive spacer being thermally coupled to the second DBM substrate.

11. The package of claim 10, further comprising a supporting pillar extending from the first DBM substrate to the second DBM substrate.

12. A package, comprising:
    a first direct bonded metal (DBM) substrate, a metal surface of the first DBM substrate defining a first outer surface of the package;
    a second DBM substrate, a metal surface of the second DBM substrate defining a second outer surface of the package;
    a first vertical stack within the package including:
        a first semiconductor die disposed between the first DBM substrate and the second DBM substrate, the first semiconductor die being thermally coupled to the first DBM substrate, and
        a first conductive spacer disposed between first semiconductor die and the second DBM substrate, the first conductive spacer being thermally coupled to first semiconductor die and to the second DBM substrate, wherein a longitudinal dimension of the first conductive spacer is greater than a longitudinal dimension of the semiconductor die;
    a first molding material disposed in a space between the first semiconductor die and the first DBM substrate; and
    a second molding material encapsulating the first molding material and the first conductive spacer.

13. The package of claim 12, further comprising a supporting pillar extending from the first DBM substrate to the second DBM substrate.

14. The package of claim 12, wherein the first semiconductor die includes at least one insulated-gate bipolar transistor device.

15. The package of claim 12, further comprising:
    a second vertical stack including a second semiconductor die and a second conductive spacer disposed between the first DBM substrate and the second DBM substrate, the second semiconductor die being thermally coupled to the second conductive spacer, one of the second semiconductor die or the second conductive spacer being thermally coupled to the first DBM substrate and the other of the second semiconductor die and the second conductive spacer being thermally coupled to the second DBM substrate.

16. The package of claim 15, further comprising:
the first molding material disposed in a space between the first DBM substrate and the one of the second semiconductor die or the second conductive spacer thermally coupled to the first DBM substrate; and
the second molding material encapsulating the first molding material and the other of the second semiconductor die and the second conductive spacer thermally coupled to the second DBM substrate.

17. The package of claim 15, wherein the second semiconductor die includes at least one fast recovery diode.

18. The package of claim 15, wherein the second semiconductor die is electrically coupled to the second conductive spacer.

19. The package of claim 15, wherein the second conductive spacer is electrically coupled to the first DBM substrate.

20. A package, comprising:
a semiconductor die disposed between a first high voltage isolation carrier and a second high voltage isolation carrier, the semiconductor die being thermally coupled to the first high voltage isolation carrier;
a conductive spacer disposed between the semiconductor die and the second high voltage isolation carrier, the conductive spacer thermally coupled to the semiconductor die and to the second high voltage isolation carrier;
a first molding material disposed in a space between the first semiconductor die and the first high voltage isolation carrier; and
a second molding material encapsulating the first molding material and the first conductive spacer,
wherein at least one of:
the conductive spacer coupled to the semiconductor die, in a horizontal plane, has a shape of a rounded rectangle or a rounded square; and
the semiconductor die, in a horizontal plane, has a shape of a rounded rectangle or a rounded square.

21. The package of claim 10, wherein first conductive spacer and the second conductive spacer are copper metal blocks.

* * * * *